United States Patent [19]
Wong

[11] Patent Number: 4,748,626
[45] Date of Patent: May 31, 1988

[54] VITERBI DECODER WITH REDUCED NUMBER OF DATA MOVE OPERATIONS

[75] Inventor: Chin-Pan Wong, Davie, Fla.

[73] Assignee: Racal Data Communications Inc., Sunrise, Fla.

[21] Appl. No.: 7,860

[22] Filed: Jan. 28, 1987

[51] Int. Cl.[4] .......................... G06F 11/10; H04L 1/00
[52] U.S. Cl. ........................................ 371/30; 371/43; 375/17; 375/39
[58] Field of Search ............... 371/43, 44, 45; 375/17, 375/34, 39

[56] References Cited

U.S. PATENT DOCUMENTS

| | | | |
|---|---|---|---|
| 4,240,156 | 12/1980 | Doland | 371/43 |
| 4,581,601 | 4/1986 | Calderbank et al. | 375/94 |
| 4,583,236 | 4/1986 | Kromer et al. | 375/17 |
| 4,586,182 | 4/1986 | Gallager | 371/30 |
| 4,601,044 | 7/1986 | Kromer, III et al. | 375/17 |
| 4,606,027 | 8/1986 | Otani | 371/43 |
| 4,630,032 | 12/1986 | Gordon et al. | 371/43 X |
| 4,631,735 | 12/1986 | Qureshi | 375/34 |
| 4,710,746 | 12/1987 | Shimoda | 340/347 DD |

FOREIGN PATENT DOCUMENTS 85300803 9/1985 European Pat. Off. .

OTHER PUBLICATIONS

G. David Forney, Jr., "The Viterbi Algorithm", IEEE, vol. 61, No. 3, Mar. 1973, pp. 268-278.

Primary Examiner—Charles E. Atkinson
Attorney, Agent, or Firm—William A. Newton

[57] ABSTRACT

Disclosed is a modem including a transmitter having a convolutional encoder for transforming each time unit digital data into an expanded bit sequence having symbol-selecting bits and subset-selecting bits, the transmitter further providing modulation of a carrier signal and a receiver wherein a Viterbi decoder determines the maximum likelihood path through a trellis from a plurality of surviving paths using a wraparound memory wherein in each addressable location indexed to a current state of a surviving path there is stored a previous state of that surviving path.

22 Claims, 11 Drawing Sheets

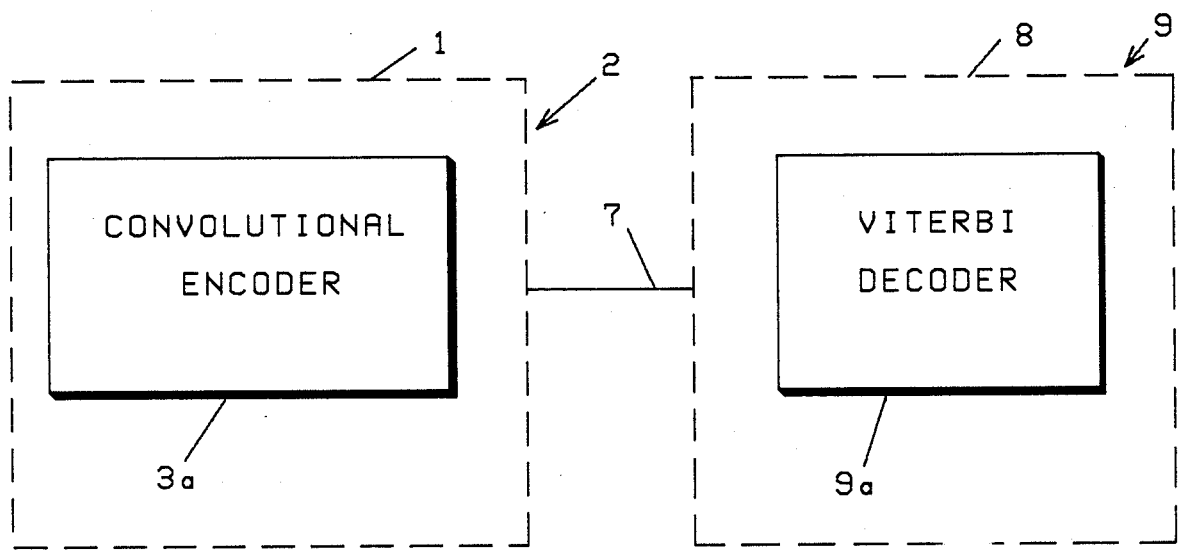
FIG. 2B (PRIOR ART)
FIG. 3
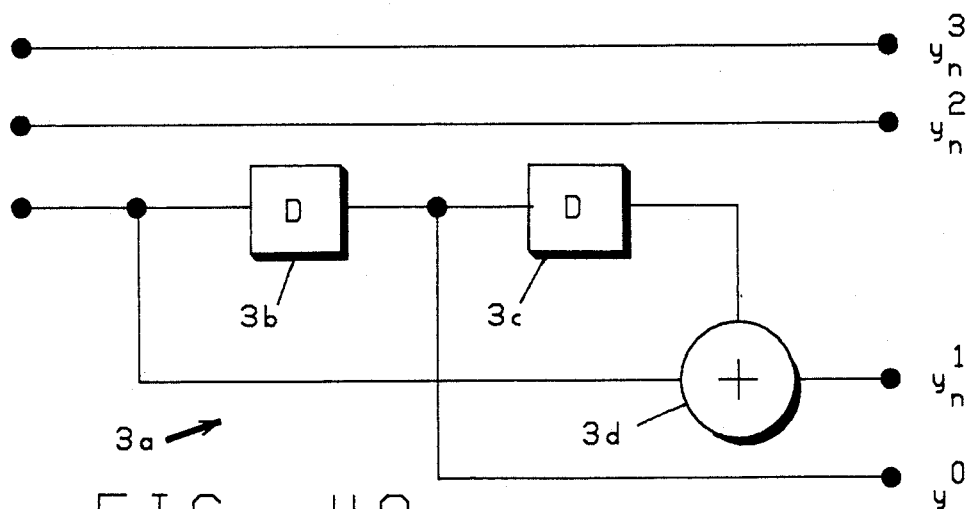
FIG. 4A

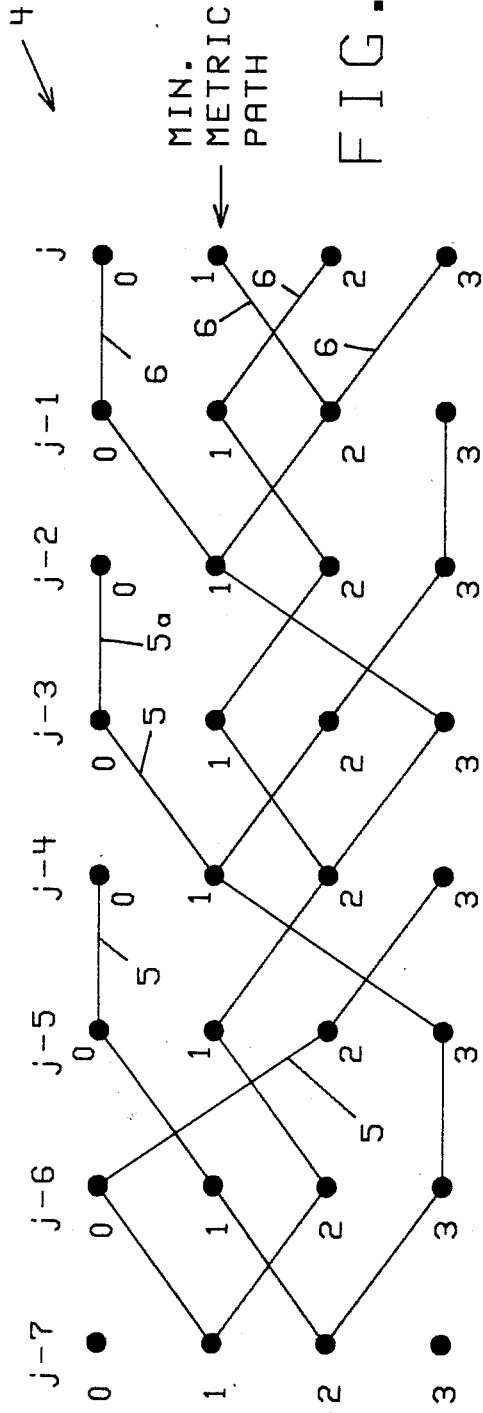

FIG. 8A

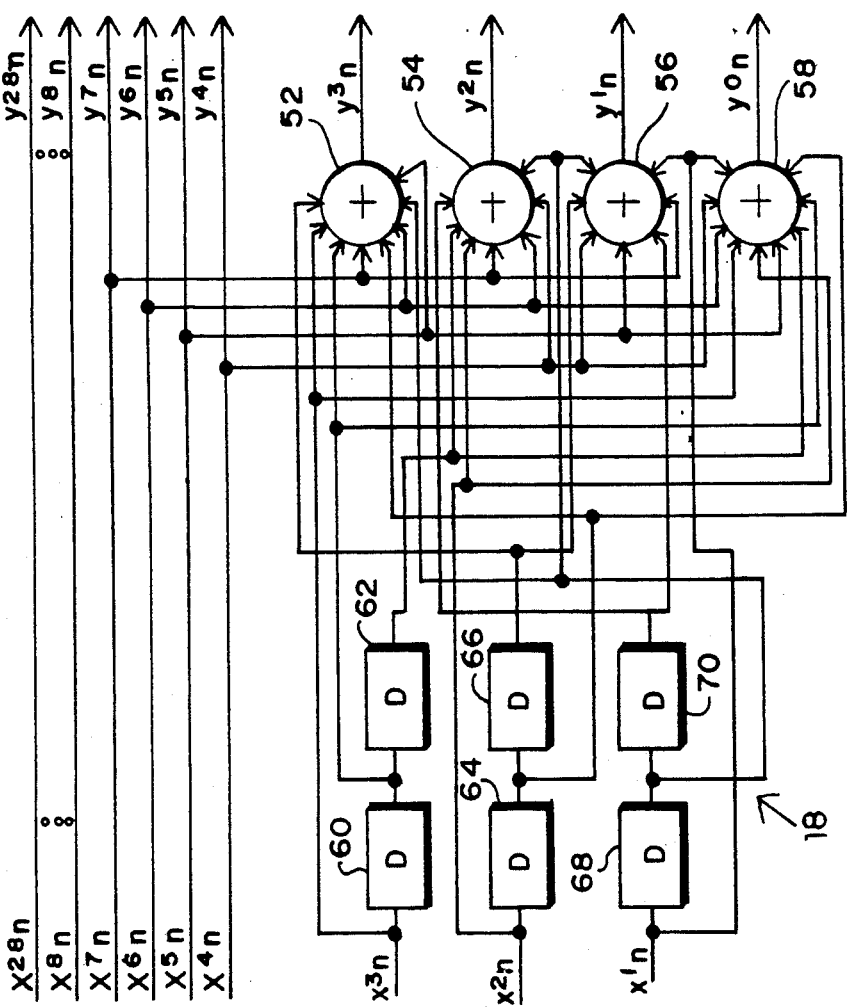
FIG.13
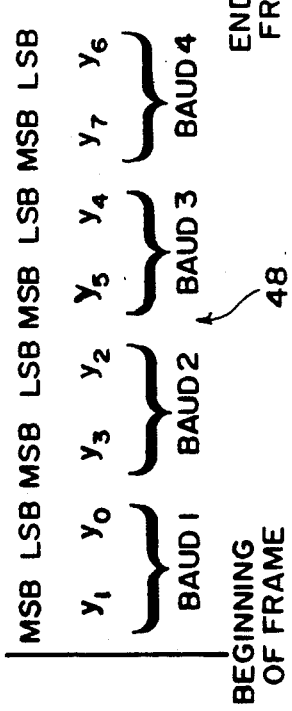
FIG.10
FIG.12

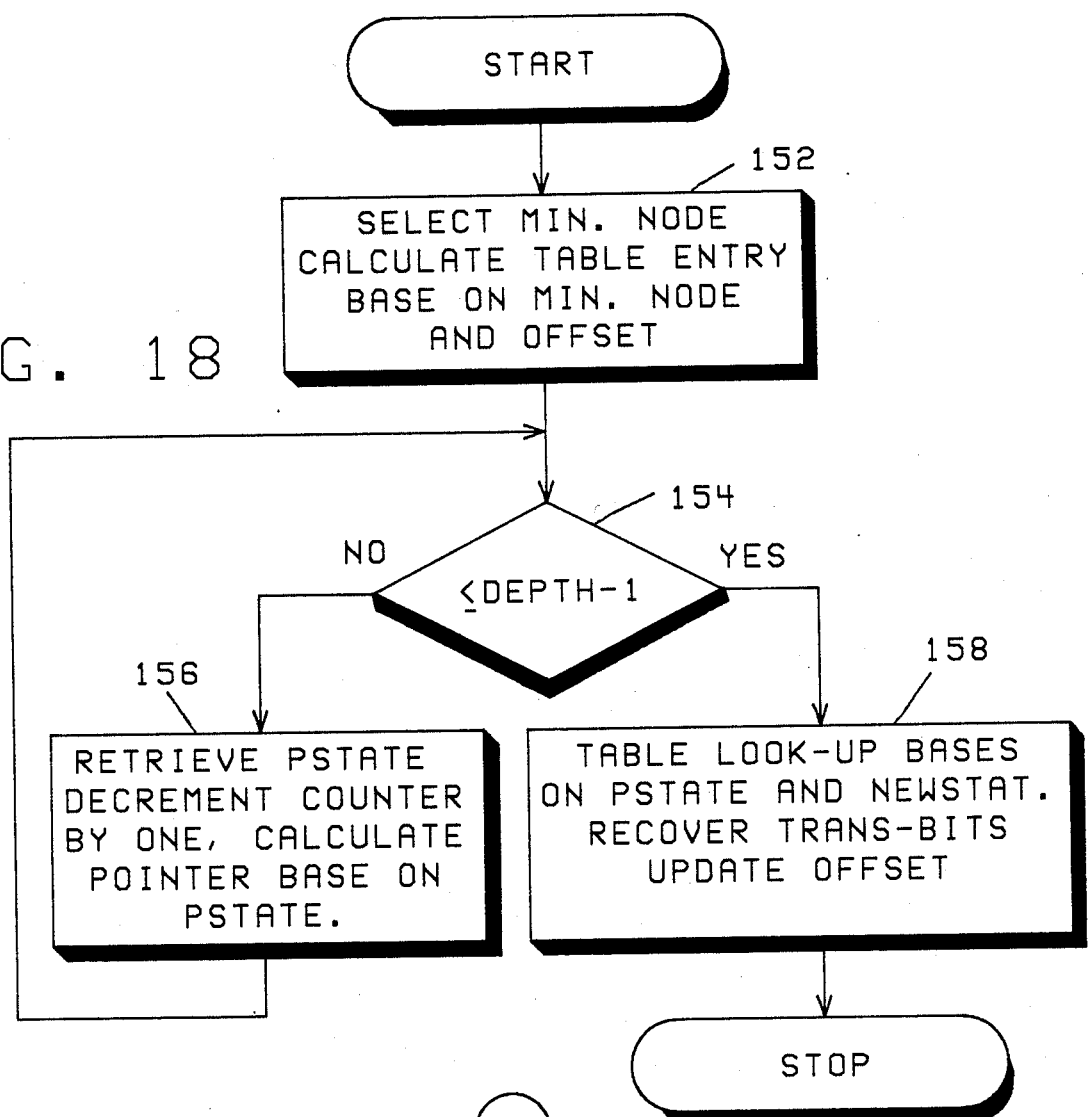
FIG. 18
FIG. 19

VITERBI DECODER WITH REDUCED NUMBER OF DATA MOVE OPERATIONS

BACKGROUND

1. Field of the Invention

The present invention relates to Viterbi decoders for determining a maximum likelihood path through a trellis created by a convolutional code.

2. Description of the Prior Art

A Viterbi decoder is used to decode convolutional codes, such codes being used to reduce error rates and increase the signal-to-noise ratio in a transmission system over band limited transmission channels. The Viterbi decoder is described in detail in an article entitled "The Viterbi Algorithm" in the Proceedings of the IEEE, Vol. 61, No. 3, March, 1973.

Depending on the encoder design, 2-dimensional convolutional encoding is used as shown in U.S. Pat. No. 4,601,044 to Kromer, III. et al or multidimensional coding (where the number of dimensions is greater than 2) is used as shown in European patent application No. 85300803.5 to Gallager. The Viterbi decoder in the receiver uses the received 2-dimensional or multidimensional signals to estimate the original path of the encoder through the trellis. The maximum likelihood path is determined by finding the possible sequence of 2-dimensional symbol subsets (which trellis path) which is closest to the sequence of received signals. The receiver computes the minimum cost path and from the path history, determines an estimated received symbol.

As to the specific way in which the Viterbi decoder was implemented in the computer programs of the prior art modems, the following description is provided. Referring to FIGS. 1A through 1C, the prior art implementation of the Viterbi decoder will be illustrated in a simple example. In this example, the Viterbi algorithm is used in conjunction with a simple convolutional encoder having four states identified as 0, 1, 2, and 3 in the trellis of FIG. 1A. A convolutional encoder is a finite state device which passes through a succession of the states, with each state being separated in time as shown by time unit j. The trellis is used to diagram all permissible transitions between the present state to the next state of the encoder, with each of the branches between states being identified by a unique encoder binary output, referred to as the subset-selecting bits and designated in FIG. 1A as a, b, c, or d. Each of these subset-selecting bits (a pair of bits in this case) map upon a given subset of symbols.

Beginning at time unit $j=m+1$, the branch metric is calculated for the paths, i.e., branches, entering each state 0, 1, 2 and 3, as shown in FIG. 1A. For each state at time unit $m+1$, the survivor path with the smallest metric $w'$ is determined, as shown in FIG. 1B. The paths are stored, either by storing the subset-identifying bits or the states, and the metrics $w'$ for the paths are stored. Referring to FIG. 1C, the unit time j is increased by one. Metrics $w''$ for all of the paths entering the states at $j=m+2$ are computed by adding calculated branch metrics of the branches from $j=m+1$ to $j=m+2$ to the surviving metrics $w'$ of the connecting survivor paths at the preceding unit. At this point, each surviving metric $w'$ includes only the previously calculated branch metric, but with the passing of more time units, each surviving metric $w'$ for a given path will be the summation of all the branch metrics of the path up to that time unit. Again for each state, the path with the smallest metric (the survivor) is selected, eliminating all other paths and reducing the trellis to that shown in FIG. 1C. For each state, the surviving path is stored, together with its metric.

The path histories are extended each time unit as described above. Once the stored path histories are extended so that $j=m+L-1$ (where L is the truncation length), the decoder finds the minimum cost path (smallest metric) among the surviving paths. For the surviving path, the decoder provides the best estimate of the subset or state at $j=m$. This is repeated each time unit, so that, e.g., at $j=m+L$, the decision is made for the state or subset at $j+m+1$.

There are $2^k$ states in the trellis ($k=2$ in this example). Consequently, for each time unit, $2^k$ words of storage are needed for the survivors and to store the entire path histories, an information sequence of length $2^k \times L$ must be stored. As shown in FIG. 2A, the prior art technique for storing these information sequences in memory comprised a memory array as shown. For each time unit, the subset-selecting bits (or states) of a given surviving path are stored in a row. Referring to FIG. 2A, if we assume at time interval $j-1$ that the subset-selecting bits are ordered in the trillis a, b, c, d and that the extension of the path will result in the subset-selecting bits being reorganized in the order of a, c, b, and d at time unit j, each of the rows representing the path histories must be shifted as shown by the arrows in FIG. 2A to obtain a rearranged memory of FIG. 2B. To accomplish this, it is assumed that the states are sequentially updated. At state 0, register 3 is written in FIG. 2A to the first row in FIG. 2B. As a result, the register 0 is destroyed by register 3. So when state 1 is updated, the survivor in register 0 is lost. One way of solving problem is to store register 3 in a buffer (not shown) and then copy register 2 in FIG. 2A to row 3 in FIG. 2B, register 1 in FIG. 2A to row 2 in FIG. 2B, register 0 in FIG. 2A to row 1 in FIG. 2B, and store the row stored in the buffer back to row 0. For a convolutional code with many states, the algorithm is very complex.

Consequently, from an implementation point of view, each time j is updated, each state could come from multiple states of time $j-1$. Therefore, all the paths need to be reshuffled according to the new order of the subset-selecting bits at time j. In addition, in order to rearrange the path of a particular state when the survivors of all the other states have not been determined, it is necessary to have temporary buffers to prevent overwriting of the path's history. An alternative would be to maintain two tables.

As a result of this prior art design, at each time instant j, the operation of reading the past paths and writing to the new locations is required. For a convolutional code with many states, it creates a great number of data moves. For example, a 64 states convolutional code with a truncation length of 20 needs $64 \times 20$ read and write operations.

In prior art schemes the states have been stored instead of the subset-selecting bits and a look-up table has been used to generate the subset-selecting bits, when needed. In other words, in the above example, with the knowledge of two sequential inputs to the encoder, i.e., the old and new states, an output of the encoder, i.e., the subset-selecting bits, can be determined or vice versa. Since the encoder adds one bit of redundancy per time unit, the prior art scheme took advantage of this fact by storing the input of the encoder instead of the required output, so as to reduce memory requirements at the cost of having to use the lookup table to recreate the subset-selecting bits.

The above example is for 2-dimensional coded modulation wherein the output of the encoder consists of subset-defining bits that map onto two-dimensional subsets of signal points. The unit time is one baud, i.e., symbol interval or modulation period. The above example is also applicable to an N-dimensional coded modulation system (N>2), wherein the subset-defining bits map onto a multidimensional subset. In this case, the unit time is a group interval comprising a plurality of bauds and the trellis has parallel branches between states.

SUMMARY OF THE INVENTION

The present invention relates to a Viterbi decoder wherein a maximum likelihood path through a trellis is selected from a plurality of surviving paths. The improvement of the present invention comprises a memory array divided into a plurality of groups of addressable locations. Each group is associated with, i.e., indexed to, a unique one of a plurality of states of the trellis. Each addressable location within each group is associated with, i.e., indexed to, a given time unit of a sequence of time unit. From each current state, to which each memory location is also associated with, a unique branch extends backward in time to a previous state. At this point in time, each of these branches form a part of a unique surviving path terminating at the current state, although such branches may cease to be a part of a surviving path in subsequent time periods. The storage of each surviving path is accomplished by storing a previous state of the surviving path in the addressable location associated with the current state of the surviving path. Knowing this previous state determines the addressable location associated with a new current state, that contains the next previous state and so on until the entire surviving path is extracted from memory. The need for extracting the surviving path from memory occurs each time unit when the surviving path with the lowest metric, i.e., the maximum likelihood path, must be extracted to determine transition bits after a delay of a number of time units. The oldest two adjacent states from the maximum likelihood path are converted by use of a look-up table to the desired transition bits. Depending upon the embodiment, the transition bits comprise the subset-defining bits or are used to obtain the subset-defining bits The invention makes use of the recognition of a property of the trellis that at a given time unit, each new current states in the trellis is connected by the surviving path to only one previous state, even though no path, one path, or a plurality of paths may extend to the next successor state.

The invention is implemented by using a wraparound memory for storing the plurality of groups of addressable locations wherein the newest stages for the newest time unit are stored in the group of addressable locations previously containing the oldest states for the oldest time unit. The position of the group of addressable location is kept track of by using an offset pointer which cycles in a modulo manner so that no shifting in or out of the groups of addressable locations is required.

The present invention avoids the prior art schemes which require a tremendous amount of data moves to shift the data around. For example, the invention only requires L indirect reads of the memory (L is the truncation length of the Viterbi decoder). Consequently, for a 64 state convolutional code with L=20, the invention can save up to 90% of the processing time of a TMS 32020 processor. Additionally, there are other advantages in being able to vary the truncation length and to have a piggy back arrangement for parallel transition branches.

BRIEF DESCRIPTION OF THE DRAWINGS

Further objects and advantages of the present invention will become apparent as the following description proceeds, taken in conjunction with the accompanying drawings in which:

FIG. 2B shows the paths shifted in the registers in a manner indicated by the arrows in FIG. 2A.

FIG. 3 is a simplified block diagram of the environment in which the present invention is implemented.

FIG. 4A shows a four state convolutional encoder which is used in combination with a first embodiment of the present invention.

FIG. 4B illustrates a trellis for the four state convolutional encoder of FIG. 4A.

FIG. 5 shows a look-up table wherein the new state in conjunction with the old state allows for the access of subset-defining bit pairs.

FIG. 6 is a look-up table of a first embodiment of the present invention implemented in computer memory wherein the surviving paths are stored.

FIG. 8A shows the upper two quadrants of the complex plane of the signal constellation used with the present invention.

FIG. 10 shows a data packet utilized in the present invention.

FIG. 12 shows a frame of the subset-selecting bits generated by the convolutional encoder.

FIG. 13 shows the structure of the convolutional encoder.

FIG. 18 is a flow chart of the retrieval operation for the memory shown in FIGS. 16A–C.

FIG. 19 shows the modulo characteristic of the write and retrieve operations.

DESCRIPTION OF PREFERRED EMBODIMENTS

Figure 1A:
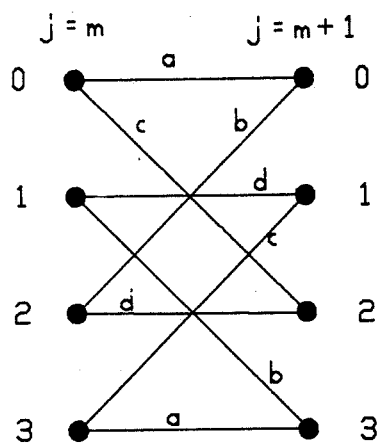
FIG. 1A is a diagram for a trellis for a convolutionally coded signal, showing all of the branches extending from the states at time unit j=m to j=m+1, prior to the selection of the surviving path.
Figure 1B:
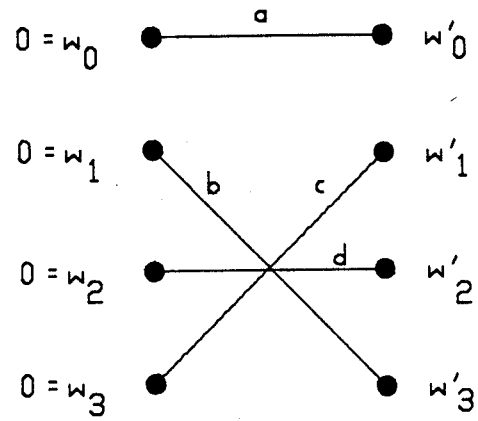
FIG. 1B shows the trellis after the surviving paths have been selected.
Figure 1C:
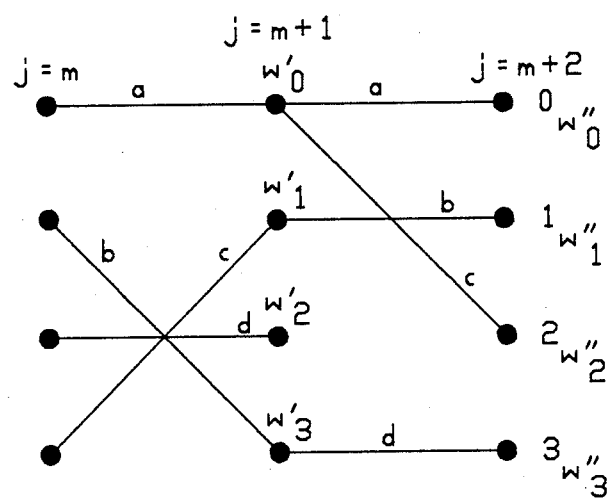
FIG. 1C shows the surviving path extended from the time unit j=m+1 to j=m+2.

Referring to FIG. 3, for the purposes of illustrating the invention in a simplified and clear manner, the improved Viterbi decoder of the present invention first is shown implemented with a 2-dimensional convolutional code in a transmitter 1 of a modem 2. The 2-dimensional convolutional code is created by an illustrative convolutional encoder 3 with four states. In FIG. 4A the convolutional encoder 3a is shown and includes two delay elements 3b and 3c and one Exclusive Or 3d. This convolutional encoder 3a is shown in FIG. 6 of and described in detail in the incorporated U.S. Pat. No. 4,601,044 to Kromer et al. After a description of this first embodiment, the improved Viterbi decoder is described in detail in conjunction with its implementation in a second embodiment for a N-dimensional coded modulated systems, where N is greater than 2.

FIG. 4B represents an illustrative trellis 4 of the convolutional encoder 3a of FIG. 4A. In the trellis, for each time unit $j-i$ (where $0 \leq i \leq 7$), the four states are repeated and are identified as 0, 1, 2 and 3. In the first illustrative embodiment, the time unit is one baud, i.e., one symbol interval or modulation period. Each branch 5 of the trellis 1 represents a permissible transition of the encoder 3a from one state to another. Consequently, the trellis is used to diagram all permissible transitions between the present state and the next state of the encoder. Since the encoder passes through a succession of states, a plurality of paths 6 are defined by the interconnection of the branches 5. As shown at time unit $j-2$, although a plurality of paths may extend forward in time from a given state, there is only one path extending backward in time from any given state. For example at $j-2$, the state 1 has two paths extending forward therefrom, but extending backward the two paths have merged to a single path.

For each permissible transition from one state to another, the encoder 3a provides a two bit output (identified as subset-defining bit group), which is mapped onto one of four possible subsets of signal symbols (points) in a 2-dimensional signal constellation, as shown in incorporated U.S. Pat. No. 4,601,044. Referring to FIG. 5, for each permissible transition from an old state to a new state, the subset-defining bits of the encoder 3a are shown in decimal form, thereby defining the interval logic of the convolutional encoder 3a. The "x's" represent an impermissible transition.

In a conventional manner, as shown in U.S. Pat. No. 4,601,044, the convolutionally encoded signal is modulated in the transmitter 1 and is transmitted over a band limited transmission medium 7, e.g., telephone lines, as shown in FIG. 3. In a receiver 8 of a modem 9, the received signal is demodulated to provide received 2-dimensional, subset defining bit groups. In a well-known manner in a Viterbi decoder 9a, by means of the maximum likelihood sequence estimation technique using the Viterbi algorithm, the maximum likelihood path is determined.

As is well-known, the Viterbi decoder 9a, during each symbol interval, i.e., modulation period or baud, extends each of the surviving paths to their next successor state. The metric of the extended path is obtained by adding the metric of the surviving path to the branch metric of the corresponding branch which extends the path. The survivor at the next frame and at a given state is found by comparing the metrics of all the extended paths which connect to a given state and choosing the minimum. Thus, the path history of the surviving path is extended. Once the path history is extended the Viterbi decoder finds the minimum cost path among the survivors, and from the path history outputs the best estimate of the subset-defining bit group for the symbol interval that is a predetermined number of symbol intervals in the past. As an example, in FIG. 4B, the path with the minimum cumulative metric is shown by asterisks extending from time unit j back in time to time unit $j-7$. In time unit j, the decoder would determine the best estimate of the state of the encoder at $j-7$ to be state 1.

Up to this point in the description, the structure described is of a well-known conventional design. The novelty of the invention resides in the manner in which the path histories of the trellis are stored in memory for use in calculating the best estimates of the subset-defining bit groups. The invention makes use of following properties of the trellis:

1. At a given time unit $j-i$, each new state in the trellis is connected by one of the surviving paths to only one previous state. In a trellis for a 2-dimensional coded modulated system, as shown in FIG. 4B, each new state is connected to only one old state by a single branch. As will be discussed hereinafter, in an N-dimensional modulated system (N>2), there will be a plurality of parallel branches extending backward from the new state to the single old state.

2. By knowning the states at $j-i$ and $j-i-1$, the subset-defining bit groups, which are indexed to the transitions from $j-i$ to $j=i-1$, can be determined, by using, for example, the look-up table of FIG. 5. In the preferred embodiment, this table is stored in the memory of a microcomputer in the receiver 8 of FIG. 3. For the purposes of the claims, in this embodiment, transition bits are the subset defining bits, with there being one subset-defining bit group for each baud.

As a result of these two properties, the most likely path is reconstructed and retrieved by use of a look-up table, i.e., the predecessor states table, of FIG. 6. Such a look-up table is stored in memory. The columns of memory of FIG. 6 are associated with (indexed to) a time unit $j-i$, where $0 \leq i \leq L-1$ (L being the truncation length of the Viterbi decoder). Since a decision at time unit j is made to determine the best estimate of the state at $j-L-1$, for each of the surviving paths, L states must be stored and the cumulative metric of the path. For this simple embodiment, each stored state comprises a 2-bit word. Although for the purposes of simplicity, L is shown to be 7 time units are shown in FIG. 6, typically L is 16 to 20 time units.

In addition to the indexing of each time unit, each row (group) of the memory of FIG. 6 is associated with (indexed to) a unique one of the four states of the trellis. Consequently, at a given time unit $j-i$, each addressable location is associated with a unique branch. As previously explained, a unique one of the branches extend backward to the previous state from each current state, even if no branch, one branch or a plurality of branches extend forward from each current state. Consequently, each addressable location is associated with not only a unique state, but also a unique branch extending backward from that state. At that point in time (time unit j), each unique branch (four in number) extending back from the current states forms a part of one of four unique surviving paths, although for later time units that branch may cease to be part of one of the surviving branches, as illustrated by branch 5a in FIG. 4A.

The memory locations preferably, but not necessarily, are indexed from the top to the bottom to the states shown adjacent to the right-most column. Each of the four surviving paths ends with its current state at j in one of the addressable locations in the memory column for j. There is only one surviving path ending in each of these locations. In summary, for each path history (and therefore each row), there must be L addressable memory locations, with each location having an n bit word, where n=2 in the illustrative first embodiment (L and n are integers). There is only one row associated with each state and each addressable location therein is associated with a given time unit from a sequence of consecutive time units. In FIG. 6, the columns are numbered 1 through 7 in the table.

In the column of time unit $j-i$, in each addressable location representing the termination of a branch at a state indexed to that location, there is stored the location at time unit $j-i-1$ of the starting state of that branch. For example, assuming that the path ending in at state 2 (row 3) has the smallest metric, its history can be retrieved back to time unit $j-6$, as shown by the asterisk values. The history of this maximum likelihood path is extracted one branch at a time. More specifically, at j, the stored value in row 3 indicates that the previous state at $j-1$ is 2. This defines a branch extending from state 2 at time unit j to state 2 at time unit $j-1$. At $j-1$, going to state 2 (row 3) the table indicates that the previous state at $j-3$ is 3. At the time unit $j-3$, going to state 3 (row 4), the table indicates the previous state at $j-4$ is 0, and so on to $j-6$. With each look-up, the path is extended back by another branch. It should be noted that the pattern of the asterisk values in FIG. 6 is roughly that of the minimum metric path shown in FIG. 4.

To retrieve the path history of the minimum cost path (i.e., maximum likelihood path) indicated in FIGS. 4 and 6, the addressable memory of FIG. 6 would be accessible as follows. A memory array L(n) is defined wherein n is an index of the time units of the path history. Consequently, once the minimum metric surviving path is determined, it is known that its first location is state 2 at time unit j, which allows for the table look-ups to proceed as follows:

| Time Unit | Previous State |
| --- | --- |
| t = j | 2 = h(j-1) = table (j, 1) |
| t = j-1 | 1 = h(j-2) = table (j-1, 2) |
| t = j-2 | 3 = h(j-3) = table (j-2, 1) |
| t = j-3 | 2 = h(j-4) = table (j-3, 3) |
| t = j-4 | 1 = h(j-5) = table (j-4, 2) |
| t = j-5 | 2 = h(j-6) = table (j-5, 1) |
| t = j-6 | 1 = h(j-7) = table (j-6, 2) |

Note that each determined previous state defines in the look-up operation, the location to find the next previous state. The path recovered is as follows: 1, 2, 1, 2, 3, 1, and 2. The oldest two states at time units $j-5$ and $j-6$ define the new state and old state, respectively, in the conversion table of FIG. 5, thereby providing the required subset defining bit group for $j-5$, which is the bit pair represented in decimal form as 0.

In summary, the look-up table is formed in memory wherein a group of at least L addressable memory locations (one each time unit) is indexed to each of the states of the trellis. At a given time unit, a surviving path having a given current state will have stored at the addressable location indexed to that state, the previous state of the surviving path. For the previous time unit, knowing the previous state defines the addressable location associated with the next current state from which the next previous state can be found, and so on, until the entire path history has been retrieved from a (L)×(M) memory array, wherein M is the number of states. For the purpose of this description and the claims, each addressable location is considered indexed to a "current" state, while the contents of that location designates a "previous" state for the path having that particular current state.

Referring to FIG. 6, the invention is implemented in a wrap around computer memory in a manner that makes it unnecessary to shift the columns of states each time a new group of current states is received and the oldest group of states is no longer required. As well be described in more detail hereinafter in the discussion of the 19.2K modem implementation, an offset pointer 9b is used to mark the most current column for time unit j. For the purposes of explanation, the columns of the look-up table are labeled 1 through 7. Assuming the initial time units associated with the columns are as shown in FIG. 6, the pointer is initially pointing to column 1 as having the most current group of states. After the next time unit, the contents of column 7 (and columns before it, if any, which are not shown in the drawing) are no longer needed and the most current states are stored in the column associated with the oldest time unit, with the pointer 9b designating this time unit. For purposes of simplicity, as shown in FIG. 6, it is assumed that the number of columns in memory equals the truncation length L. The oldest group of states still needed would then be in column 6, with the time units associated with columns 7 through 1 being reordered across the top of the table to be, respectively, j, $j-6$, $j-5$, $j-4$, $j-3$, $j-2$, $j-1$. After the next group of states are received, they would be stored in column 6 (with the pointer designating the same) and the time units would be reordered to $j-1$, j, $j-6$, $j-5$, $j-4$, $j-3$, and $j-2$. This advancement of the pointer would continue for each time unit, cycling in a direction from column 7 to column 1 and then starting over at column 7 and so on. In the case where the truncation length is less than the number of columns available (L<7 in the simplified example), then the current states are still stored in the column associated with the oldest time unit. Consequently, this offset pointer indicates the current time frame with the current states. The pointer is updated by modulo arithmetic so that the wrap around nature of the data storage prevents the need for shifting the data from one column to the next.

As to the advantages of the invention, in this state history method, there is no need within the same register to connect the present path to the correct old path. At time $j-i$, it is only necessary to store the state that the path connects to at time $j-i-1$. When the minimum metric is determined, the subset-defining bits are derived by searching the state history table of FIG. 6 and then conversion table of FIG. 5. This only requires L indirect reads (L is the truncation length.) For example, as will be described in another embodiment hereinafter, for a 64 states convolutional encoder with L=20, it can save up to 90% of TMS32020 processing time.

As will become apparent from the detailed description of the embodiment for the multidimensional coded system, the invention provides other advantages. If the look-up table is large enough, the truncation length can be varied by only changing the loop count in the above method. This offers programming flexibility and no extra buffers and rearrangements are needed. If there are parallel transition branches from the old state to the new state, as there is with the multidimensional coded systems, an index can be piggy backed to indicate which parallel branch is the one entering the state. To accomplish this, an extra table read can be done or the transition branch can be derived by using the piggy back index.

Figure 7:
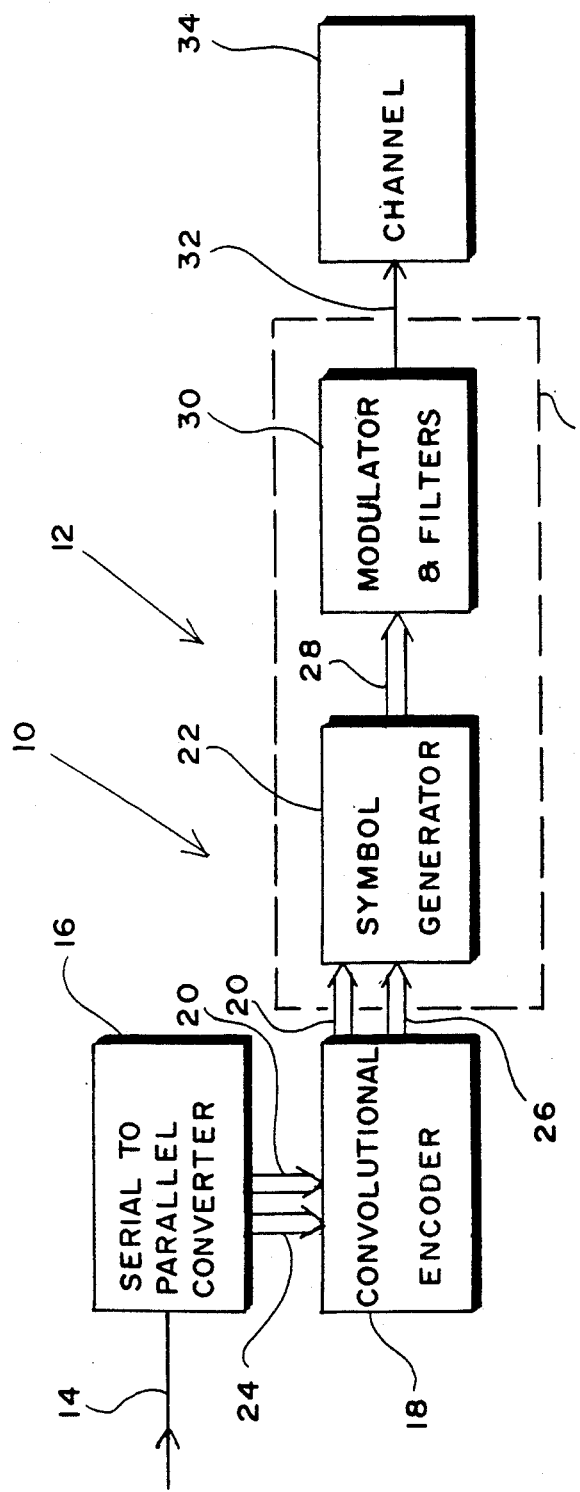
FIG. 7 shows a block diagram of a transmitter of a modem for another implementation of the present invention.

Hereinafter, the improved Viterbi decoder of the present invention will be illustrated implemented in a 19.2K bit per second modem using N-dimensional convolutional coding. Referring to FIG. 7, there is shown a block diagram of the generalized structure of a transmitter 10 of a modem 12 in which the present invention is implemented. In the transmitter 10 an information bit stream 14 is made up of serial digital data from a data source (not shown). From the information bit stream 14, bit sequences of fixed length are taken by a serial to parallel converter 16 to form packets of bits which are passed on to a convolutional encoder 18. A portion of the bits of each packet, symbol-selecting bits 20, are passed through the convolutional encoder 18 to a symbol generator 22. The remaining portion 24 of the bits of the packet are passed on to the convolutional encoder 18. The convolutional encoder 18 preferably, but not necessarily, is an encoder which allows for 2n dimensional coded modulation. In the preferred embodiment, for each packet, a portion of the output of the convolutional encoder 18, i.e., subset-selecting bits 26, form a frame of an even number of bits, i.e., the subset-selection bits in a frame consist of 2n bits. In other implementations, the frame can have an odd number of bits. The subset-selecting bits 26 are passed to the symbol generator 22. For each received packet, the subset-selecting bits 26 and symbol-selecting bits 20 form an output of the encoder 18 that will be identified as the expanded bit sequence. The symbol generator 22 typically uses a pair (i.e., bit group) of the 2n subset-selecting bits each baud (i.e., symbol interval/modulation period) to specify one of four subsets into which a symbol constellation is partitioned. The symbol-selecting bits 20 are used by the symbol generator 22 to select a symbol (i.e., signal point in constellation) from each subset. Consequently, each packet from the converter 16 is mapped onto a group of n 2-dimensional symbols in n bauds (one group interval), where n is >1 and defines a multidimensional point (symbol) 28. The multidimensional symbols 28, in a conventional manner, are filtered by bandwidth limiting filters and used to modulate a carrier in modulator and filter means 30 to provide a modulated carrier signal 32 to a band limited channel 34. The symbol generator 22 and modulator and filtering means 30 define a multidimensional coded modulation means 35.

Figure 2A:
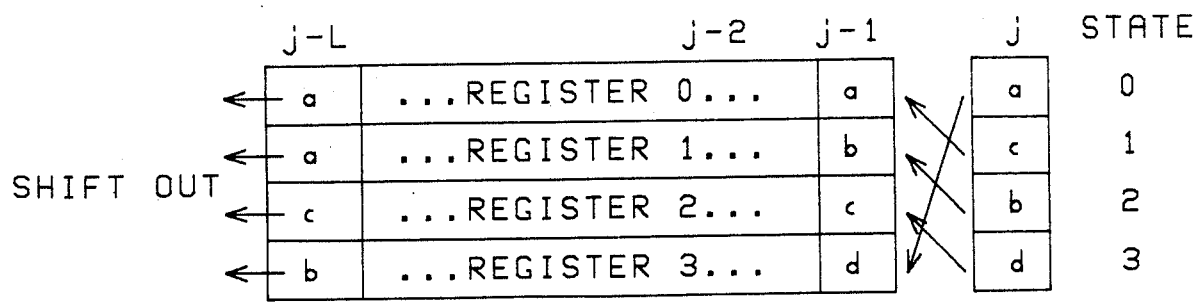
FIG. 2A shows the prior art scheme used for storing a plurality of surviving paths.
Figure 8A:
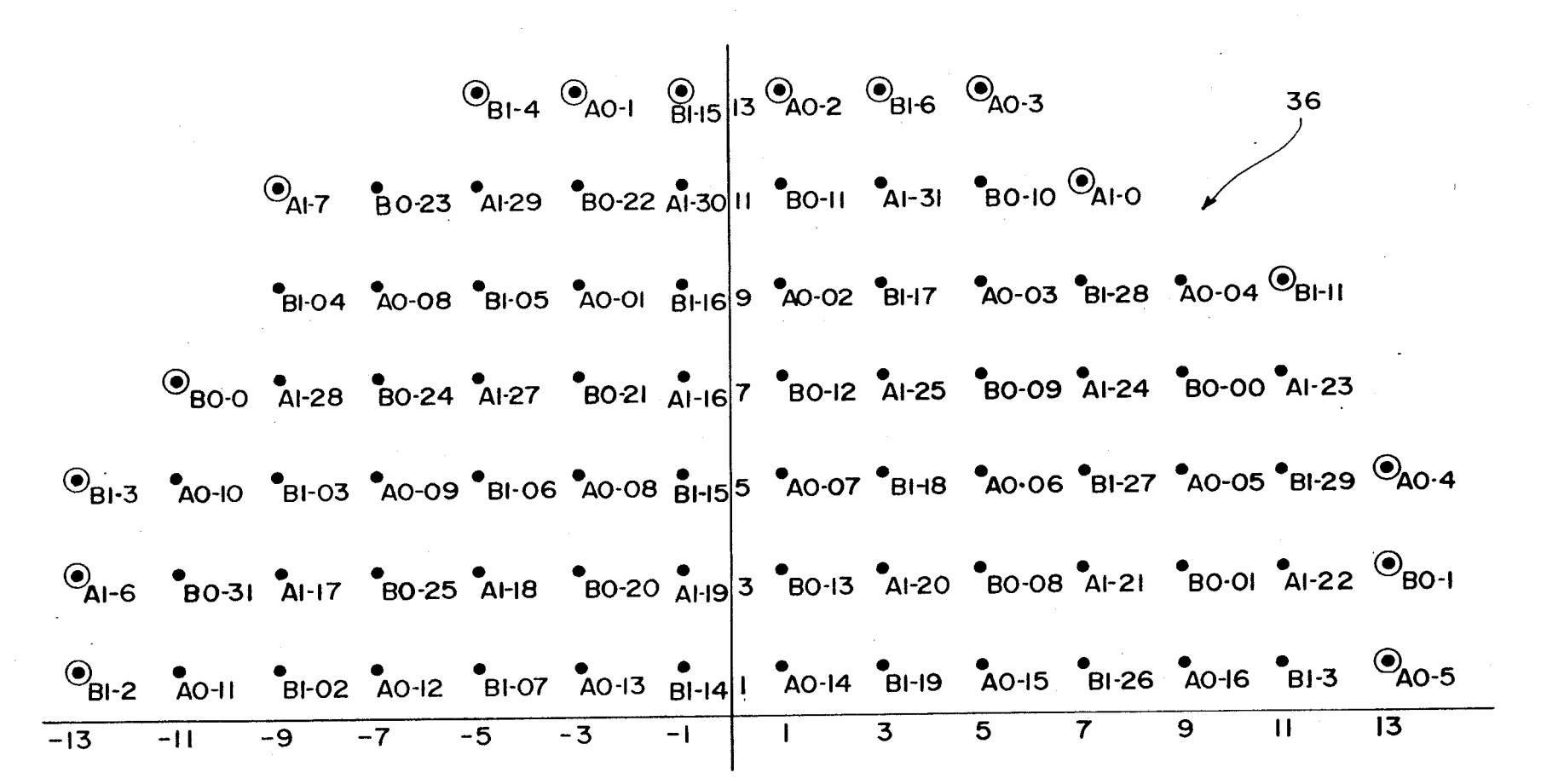
Figure 8B:
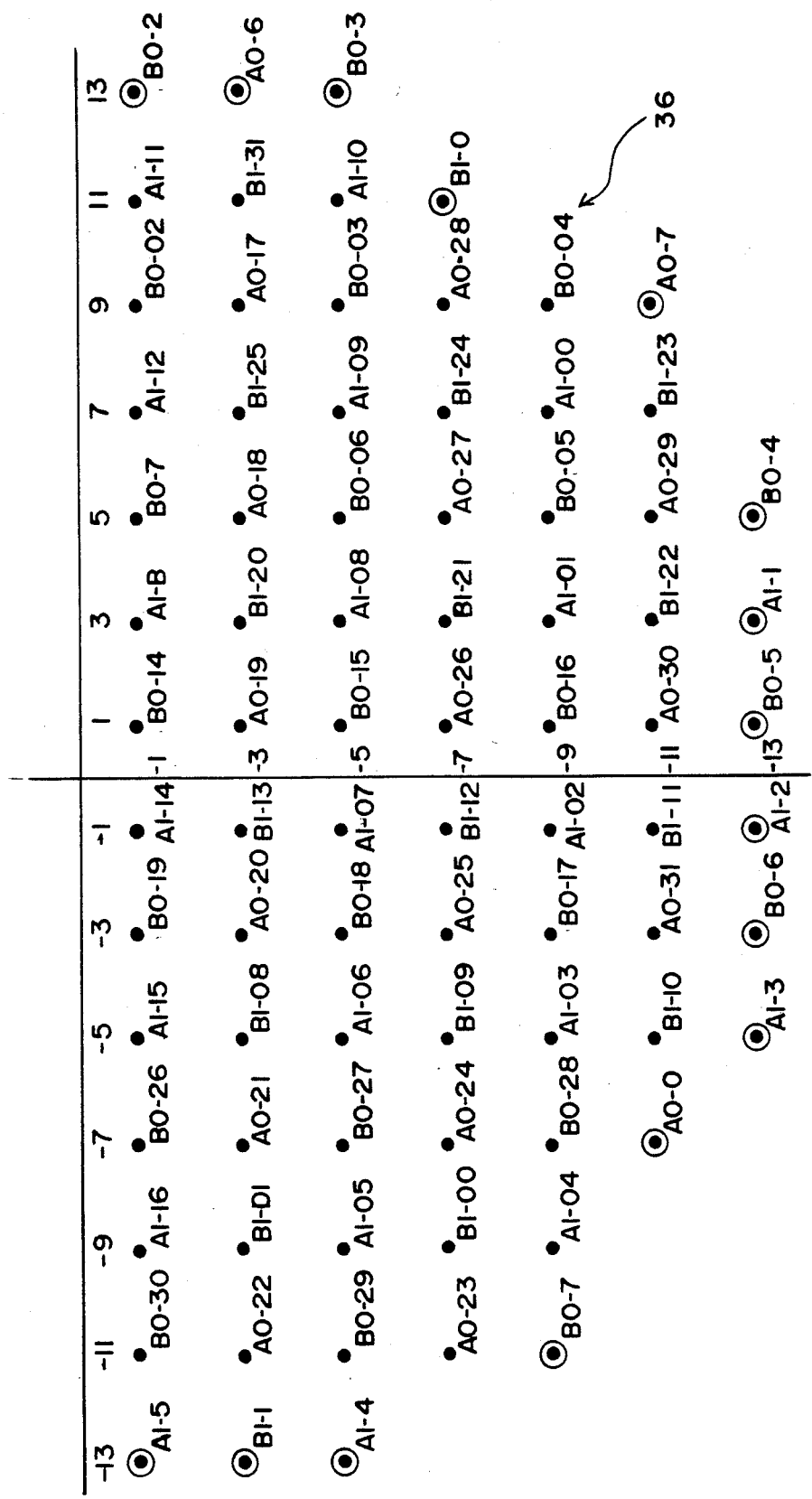
FIG. 8B shows the lower two quadrants of the complex plane of the signal constellation of the present invention.

The specific structure of the transmitter 10 will now be described. The modem 12 in which the present invention is preferably, but not necessarily, implemented transmits data at a rate of 19,200 bits per second. The symbol constellation 36 used by the symbol generator 22 of FIG. 7 is shown in FIGS. 8A and 8B, with upper two quadrants and lower two quadrants of the complex plane of the constellation 36 being shown, respectively, in FIGS. 8A and 8B. For purposes of illustration, the transmitter 10 uses eight dimensional coded mudulation. The baud rate is 2742.86 symbols per second with 7 bits per baud. The constellation 36 has 160 complex 2-dimensional symbols, i.e., signal points, with each symbol having a specific alphanumerical identifier. The symbols are divided up into outer and inner points, with a circle around each signal point that is an outside point. The symbol constellation 36 also is divided into four subsets A0, A1, B0, B1, which are the first portion of the symbol identifier. After the subset identifier, separately for both inner or outer symbol groups, the symbols within each subset are designated in the symbol identifier by the number after the hyphen. For example, the symbol identifier "A0-5" for a circled point indicates an outer point from the subset A0, with that particular point being designated by number 5 within the outer points of the subset A0. In summary, the constellation is not only partitioned into four subsets of A0, A1, B0, and B1, but the constellation is also divided into a portion having inner points and a portion having outer points. Although the preferred embodiment has four subsets, different numbers and arrangements of subsets are possible. The units of the graph of FIGS. 2A and 2B are shown in volts 0.

Each subset is represented by a two bit number shown in Table 1.

TABLE 1

| Subset | Subset Index MSB | LSB |
| --- | --- | --- |
| A0 | 0 | 0 |
| B1 | 0 | 1 |
| B0 | 1 | 0 |
| A1 | 1 | 1 |

Thus, the subset-selecting bits 26 form an output of the (m, m−1) convolutional encoder 18 of FIG. 7 which can be represented by n 2-dimensional subsets of the form shown in Table 1. The integer m is equal to 2n plus the number of symbol selecting bits. MSB and LSB stand for most significant bit and least significant bit, respectively.

Figure 9:
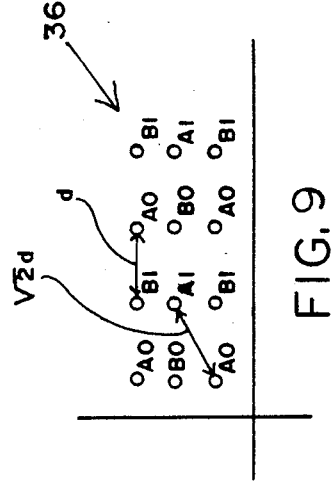
FIG. 9 shows a fragmented portion of the upper, right hand quadrant of the signal constellation and illustrates the distance properties in the constellation.

To better illustrate the subset to symbol mapping provided by the symbol generator 22, a portion of the first quadrant of the symbol constellation 36 shown in FIG. 8A is enlarged and shown in FIG. 9. The symbols of the constellation 36 are on a square grid of the complex plane. From FIG. 9 it can be seen that the maximum Euclidean distance of $2^{\frac{1}{2}}(d)$ occurs between A0 and A1 as well as between B0 and B1. The minimum distance of d is between A0 and B0, A0 and B1, A1 and B0 and A1 and B1. The maximum Hamming distance also occurs between A0 and A1, as well as between B0 and B1.

Figure 11:
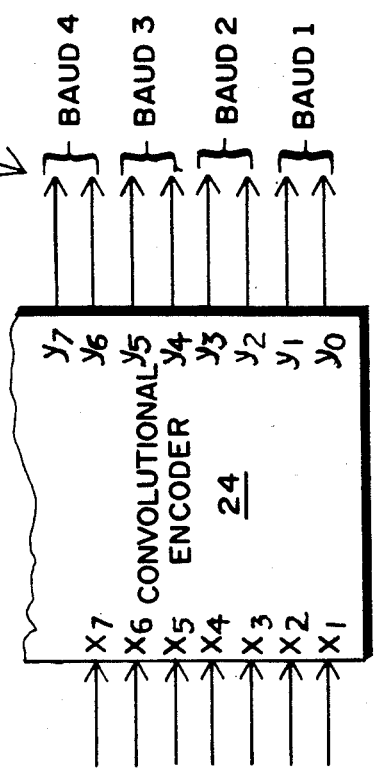
FIG. 11 is a schematic diagram of a portion of the convolutional encoder which generates the subset-selecting bits.

FIG. 10 shows a packet of data generated by the serial to parallel converter 16 of FIG. 7 which comprises 28 bits which go to the convolutional encoder 18. The bits $x_8$–$x_{28}$ are the symbol-selecting bits 20. As shown in FIG. 11, bits $x_1$, $x_2$, $x_3$, $x_4$, $x_5$, $x_6$, and $x_7$ form the input bits 24 to convolutional encoder 18. As shown in FIGS. 11 and 12, the output bits $y_7$, $y_6$, $y_5$, $y_4$, $y_3$, $y_2$, $y_1$, and $y_0$ of the encoder 18 are grouped into four bit groups ($y_7$ $y_6$), ($y_5$ $y_4$), ($y_3$ $y_2$) and ($y_1$ $y_0$) that defines a frame 48 of bits. As will be explained hereinafter, bits $x_1$–$x_7$ form only a portion of the expanded bit sequence output of the encoder 18. FIGS. 11 and 12 shows the assignment of bit groups for each baud in the frame 48, with each bit group 50 defining a bit pair in the preferred embodiment. Each frame 48 has the duration of a group interval (time interval) that is four bauds in duration. Via Table 1, each bit group 50 corresponds to one of the four 2-dimensional subsets A0, A1, B0 and B1. A symbol is transmitted from one of the 2-dimensional subsets in each of the four bauds. When viewed on a multidimensional level, each frame 48 of eight bit output of the encoder 18 corresponds to one of 256 8-dimensional symbol subsets, with each multidimensional symbol subset corresponding to a different combination of four 2-dimensional symbol subsets. For example, the multidimensional symbol subset A1 B0 A0 B0 (11100010) corresponds to 2-dimensional symbol subsets (11), (10), (00) and (10).

From this point on we will use superscripts to indicate the order of the bits inside the frame and subscripts to refer to the frame number in which the bits occurs. For example, referring to frame 48 in FIG. 12, bit x7 occurring in the nth frame will be referred to as $x_n^7$. Table 2 shows the assignment of points from inner and outer points of the constellation 36 shown in FIGS. 8A-8B for different values of $x_n^8$, $x_n^9$ and $x_n^{10}$. Bit $x_n^8$ indicates whether the frame 48 has any outer points or not. If the frame 48 (i.e., one of the bauds of the frame) were to have an outer point, then the dibit $x_n^9 \, x_n^{10}$ would indicate in which baud (and therefore bit group) the outer point would occur. In Table 2, "Inner" means inner point and "Outer" means outer point.

TABLE 2

| $x_n^8$ | $x_n^9$ | $x_n^{10}$ | baud 1 | baud 2 | baud 3 | baud 4 |
|---|---|---|---|---|---|---|
| 0 | X | X | Inner | Inner | Inner | Inner |
| 1 | 0 | 0 | Outer | Inner | Inner | Inner |
| 1 | 0 | 1 | Inner | Outer | Inner | Inner |
| 1 | 1 | 0 | Inner | Inner | Outer | Inner |
| 1 | 1 | 1 | Inner | Inner | Inner | Outer |

Table 3 shows how the symbol-selecting bits 20 of FIGS. 7 and 10 are assigned with each group of

TABLE 3

| $x_n^8$ | $x_n^9$ | $x_n^{10}$ | baud 1 | baud 2 | baud 3 | baud 4 |
|---|---|---|---|---|---|---|
| 0 | X | X | $x_n^9$–$x_n^{13}$ | $x_n^{14}$–$x_n^{18}$ | $x_n^{19}$–$x_n^{23}$ | $x_n^{24}$–$x_n^{28}$ |
| 1 | 0 | 0 | $x_n^{11}$–$x_n^{13}$ | $x_n^{14}$–$x_n^{18}$ | $x_n^{19}$–$x_n^{23}$ | $x_n^{24}$–$x_n^{28}$ |
| 1 | 0 | 1 | $x_n^{11}$–$x_n^{15}$ | $x_n^{16}$–$x_n^{18}$ | $x_n^{19}$–$x_n^{23}$ | $x_n^{24}$–$x_n^{28}$ |
| 1 | 1 | 0 | $x_n^{11}$–$x_n^{15}$ | $x_n^{16}$–$x_n^{20}$ | $x_n^{21}$–$x_n^{23}$ | $x_n^{24}$–$x_n^{28}$ |
| 1 | 1 | 1 | $x_n^{11}$–$x_n^{15}$ | $x_n^{16}$–$x_n^{20}$ | $x_n^{21}$–$x_n^{25}$ | $x_n^{26}$–$x_n^{28}$ |

FIG. 13 shows the convolutional encoder 18 of FIGS. 7 and 11 in detail. The encoder 18 is a 64 state (8, 7) encoder. As previously described, the input bits to the encoder are $x_n^i$, where i=1 through 28 and the output bits are $y_n^i$, where i=0 through 28. As is well-known, the encoder adds one redundancy bit; however, in the preferred embodiment the encoder adds less than one bit per baud of redundancy into the system. Encoders with redundancies greater than one bit (and therefore redundancy of one or greater per baud) can be used with the present invention. Input bits $x_n^8$ through $x_n^{28}$ are passed through unchanged and unused to become output bits $y_n^8$ through $y_n^{28}$. Inputs $x_n^4$–$x_n^7$ are used but pass through the encoder 18 without being changed and become output bits $y_n^4$–$y_n^7$. The input bits $x_n^1$–$x_n^3$ are expanded to create the output bits $y_n^0$–$y_n^3$. The output bits of $y_n^0$ through $y_n^{28}$ are identified as the expanded bit sequence, which includes the subset-selecting bits $y_n^0$–$y_n^7$ and the symbol-selecting bits $y_n^8$–$y_n^{28}$. The convolutional encoder 18 includes four modulo 2 adders 52, 54, 56, and 58, each connected to receive at least some of the bits $x_n^3$, $x_n^2$, and $x_n^1$. The encoder 18 includes six delay elements 60, 62, 64, 66, 68, and 70, with each element providing a delay of one group interval (four bauds).

With reference to FIG. 13, the input-output relationships of the subset-selecting bits 26 of the encoder 18 are as follows:

$$y_n^7 = x_n^7 \quad \text{(Equations 1)}$$

$$y_n^6 = x_n^6$$

$$y_n^5 = x_n^5$$

$$y_n^4 = x_n^4$$

$$y_n^3 = x_n^3(1 \oplus D) \oplus x_n^2(D \oplus D^2) \oplus x_n^1 D \oplus x_n^7 \oplus x_n^6 \oplus x_n^5$$

$$y_n^2 = x_n^3 D^2 \oplus x_n^2 \oplus x_n^1(D \oplus D^2) \oplus x_n^7 \oplus x_n^6 \oplus x_n^4$$

$$y_n^1 = x_n^2 D^2 \oplus x_n^1(1 \oplus D \oplus D^2) \oplus x_n^7 \oplus x_n^5 \oplus x_n^4$$

$$y_n^0 = x_n^3(1 \oplus D \oplus D^2) \oplus x_n^2(1 \oplus D) \oplus x_n^1 \oplus x_n^6 \oplus x_n^5 \oplus x_n^4$$

where D is a delay element and $\oplus$ means an exclusive OR operation.

Figure 14:
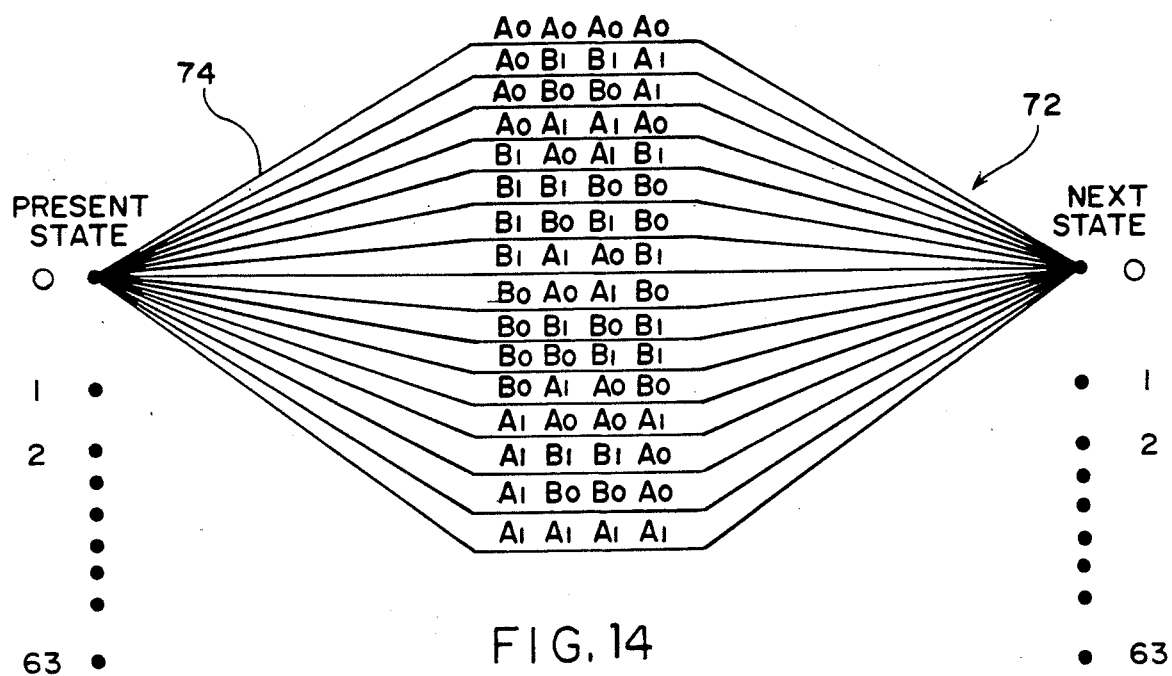
FIG. 14 shows two states of the trellis with the branches shown between the present state zero and the next state zero.

The convolutional encoder 18 is a finite state device which passes through a succession of states, with each state being separated in time by one group interval. Referring to the trellis diagrams in FIG. 14, the encoder 18 has 64 possible states (not all shown). Due to the fact that the encoder 18 has three binary inputs, for a given present state, only 8 of the next states are permissible. Which next state occurs is a function of the present state and on the combination of the $x_n^1$, $x_n^2$, and $x_n^3$ bits received each group interval. Each transition from one state to another state is identified as a branch. In general, the trellis can be used to diagram all permissible transitions between the present state to the next state of the encoder, although only the branches 74 between present state 0 and next state 0 are shown in FIG. 14. There are 256 possible branches which exist in the trellis. These 256 branches are subdivided into two groups of 128 branches each. The branches from a present state to a next state can be either from one or the other group. Extending from the present state 0, 128 branches exist in the trellis 72, with 16 branches going to each of 8 permissible next states (only one set of 16 is shown). Likewise, 128 branches can extend from each present state in the same manner and this is extended continuously between adjacent states separated by group intervals. In the preferred embodiment, the group used of the two groups of 128 branches alternates with the states, e.g., state 0 using one group and state 1 using the other group and so on.

From FIG. 13 and the Equations 1 for encoder 18, it can be shown that $x_n^7$, $x_n^6$, $x_n^5$ and $x_n^4$ do not affect the states. In other words, changing any one or all of these bits does not change the state. Hence, between any two given states occurring at successive group intervals, there will be the previously described sixteen parallel branches, with each of the sixteen branches having a different multidimensional symbol subset associated with it, as shown in FIG. 14. This set of sixteen parallel branches will be referred to as a coset. The 256 branches can be decomposed into 16 cosets. Hence, between a present state and each of 8 next permissible states, there will be 16 branches with each branch being labeled by one of the 16 multidimensional symbol subsets of a given coset. With respect to FIG. 14, in the preferred embodiment, 8 of the cosets are assigned to even number states and 8 are assigned to odd number states. For the purposes of illustration, only the multidimensional symbol subsets of the coset associated with the branches going from present state 0 to next state 0 are shown in FIG. 14. The multidimensional symbol subsets associated with each branch can be indexed by integers ranging from 0 to 255. The index can be expressed as:

Index of 8 dimensional subset = 64(index of subset for baud 4) + 16(index of subset for baud 3) + 4(index of subset for baud 2) + index of subset for baud 1.

As to the multidimensional symbol subsets associated with each branch, the 2-dimensional subsets therein preferably, but not necessarily, are ranged as a frame of subsets for bauds 4, 3, 2, 1, in that order. The encoder 18 transmits 29 bits in 4 bauds or 7.25 bits per baud.

Figure 15:
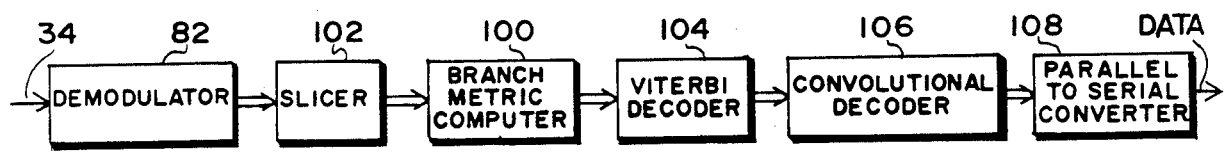
FIG. 15 is a block diagram of the receiver of the present invention.

A receiver 80 of the modem 10 is generally shown in the block diagram of FIG. 15 and includes a demodulator 82. The noise affected modulated carrier signal is received over the channel 34 and in a conventional manner that will not be detailed herein is passed through the demodulator 82 to produce a baseband signal consisting of a stream of received 2-dimensional symbol signals. As described hereinafter in detail, the rest of the circuitry processes the stream of received 2-dimensional symbol signals and decides which of the multidimensional symbols were sent by means of the maximum likelihood sequence estimation technique using the Viterbi algorithm. The maximum likelihood path is determined by which permissible multidimensional symbol sequence is closest in Euclidean distance squared (as will be described hereinafter) to that of received multidimensional symbol sequence.

A branch metric is the distance between a received multidimensional signal and possible multidimensional symbol from the multidimensional symbol subset corresponding to the branch of the trellis. A Viterbi decoder (to be described hereinafter) computes a cumulative path metric for each of the survivor paths during each frame. This cumulative path metric is the arithmetic sum of the metrics of the individual branches which form the particular path. Hence, it is necessary to first obtain the branch metric for each of the previously described 256 branches. As mentioned earlier, the indices of the ideal multidimensional symbols are in one to one correspondence with the sequence of baud based 2-dimensional symbol sets. Hence, in order to find the distance between a received branch and an ideal branch with a certain index value, it is necessary to know when the receiver frame starts.

Referring to FIG. 15, the operation of slicer 102 will be described. Each received multidimensional signal provides information in the form of the multidimensional subsets of the multidimensional points sent. As previously mentioned, the received 8-dimensional signal can be decomposed into four 2-dimensional signals which occur consecutively. More specifically, each frame of the received multidimensional signal can be represented as R(1), R(2), R(3), and R(4), where:

$$R(J) = [RX(J), RY(J)], \quad 1 < J < 4 \quad \text{(Equation 2)}$$

A symbol (ideal point) in the signal constellation can be represented as:

$$IDL(L, N) = [IDLX(L, N), IDLY(L, N)] \quad \text{(Equation 3)}$$

where
L=1 means that the point belongs to subset A0
L=2 means that the point belongs to subset B1
L=3 means that the point belongs to subset B0
L=4 means that the point belongs to subset A1 and
N=index of the point in the subset.

For each L and J, the slicer 102 finds the $N = N_{min}$, such that $$|R(J) - IDL(L, N_{min})| < |R(J) - IDL(L,N)| \quad \text{where} \quad \text{(Equation 4)}$$

$$|R(J) - IDL(L, N)|^2 = |RX(J) - IDLX(L,N)|^2 + |RY(J) - IDLY(L,N)|^2$$

The slicer 102 thus finds four nearest points for the received signal of each baud. For each baud of the four baud frames, we can denote the distance (metric) between each of the ideal point and the received point as $d[J, L(J), N_{min}(J)]$. Thus $$[d[J, L(J), N_{min}(J)] = |R(J) - IDL[L(J), N_{min}(J)]| \quad \text{(Equation 5)}$$

As previously explained, each branch of the trellis corresponds to a possible multidimensional symbol subset (therefore a four baud signal in the frame) and in this embodiment there are 256 branches, i.e., A0 A0 A0 A0 through $A_1 A_1 A_1 A_1$. The branch metric computer 100 computes the branch metric term, which can be either equal to or proportional to $d_{BRANCH}(I)$ where $d_{BRANCH}(I)$ is defined by:

$$d_{BRANCH}(I) = [d^2(1, L(1), N_{min(1)}) + d^2(2, L(2), N_{min(2)}) + d^2(3, L(3), N_{min(3)}) + d^2(4, L(4), N_{min(4)})] \quad \text{(Equation 6)}$$

The index I identifies the branch and extends from 0 to 255, showing that this calculation is repeated for each branch. Consequently, at this point we have 256 $d^2$ values, one for each of the 256 branches, with each squared distance $d^2$ value representing the squared distances between the received 2-dimensional signal and the contending 2-dimensional symbol subsets.

Next, the branch metric computer 100 selects for each coset (group of 16 branches each) that branch which has the minimum branch metric, which results in reducing the number of contending branches (multidimensional symbol subsets) from 256 to 16. Only one branch of each coset can form a part of the maximum likelihood path. Thus, the described reduction by a factor of 16 of the contending branches is based upon which branch of said coset represents the multidimensional symbol subset which is closest to the received multidimensional signal.

Generally, the Viterbi decoder 104 in the receiver 80 uses the received multidimensional signals to estimate the original path of the encoder 18 through the trellis, such trellis being discussed with respect to FIG. 14. During every frame, the receiver computes the minimum cost path and from the path history, determines the estimated multidimensional symbol. As is well-known, the Viterbi decoder 104, during each frame (group interval) extends each of the surviving paths to their successor state at the next frame. The metric of the extended path is obtained by adding the metric of the survivor to the branch metric of the corresponding branch which extends the path. The survivor at the next frame at a given state is found by comparing the metrics of all the extended paths which connect to a given state and choosing the minimum. More specifically, extending the paths' histories can be mathematically characterized by computing:

$$c(i, n) = \underset{j}{\text{Minimum}} \{c(j, n-1) + r(i, j)\} \quad \text{(Equation 7)}$$

where $c(j, n-1)$ is the surviving metric of the jth state at time $t=(n-1)T_{frame}$, $r_{(i,j)}$ is the branch metric of the output branch which connects the jth state at time $t=(n-1)T_f$ to the ith state at $t=nT_f$. $c(i, n)$, the cost at the ith state at time $t=nT_f$, is obtained by minimizing over all j which are connected to state i. Thus, the path history of the surviving paths is extended. Once the path history is extended the decoder 104 finds the minimum cost path among the survivors, and from the path history outputs the best estimate of the multidimensional symbol subset for the group interval to a conventional decoder 106. The delay between the present frame and the present estimate (of the past symbol) can be 3v frames, where v is the constraint length of the convolutional encoder 18 and in this case is 6.

From the retained knowledge of the received multidimensional sequence and from the knowledge of the closest multidimensional symbol subset of the maximum likelihood path, the best estimate of the transmitted multidimensional symbol (point) is obtained. From the estimated, transmitted multidimensional signal the convolutional decoder 106 produces the packet data. Finally a serial to parallel converter 108 converts this packet to serial data.

The modem in which the present invention is implemented is a microprocessor based modem. As will be appreciated by those in the art, the microprocessor-based modem control and data processing circuits also typically include the usual data storage elements (e.g., ROM for program control storage and the like, and RAM for variable input/output/intermediate result data, etc.) conventionally associated with a microprocessor CPU for performing desired manipulation of digital signals in accordance with a stored program. In the presently preferred exemplary embodiment, these already present microprocessor CPU, ROM and RAM elements are also utilized to perform the functions of the present invention. With the present invention, the modem functions are implemented in Texas Instrument's TMS 32020 processors. With respect to FIG. 7, all of the transmitter modem functions therein are preferable, but not necessarily, performed by the digital signal processor. As is well-known, after filtering in block 30, a D/A converter and antialasing filters are used. With respect to FIG. 15, all of the receiver modem functions of FIG. 15 are preferably, but not necessarily, performed by the digital signal processor. As is well-known, prior to demodulation, the received signal is processed by an A/D converter and filters.

Figure 16:
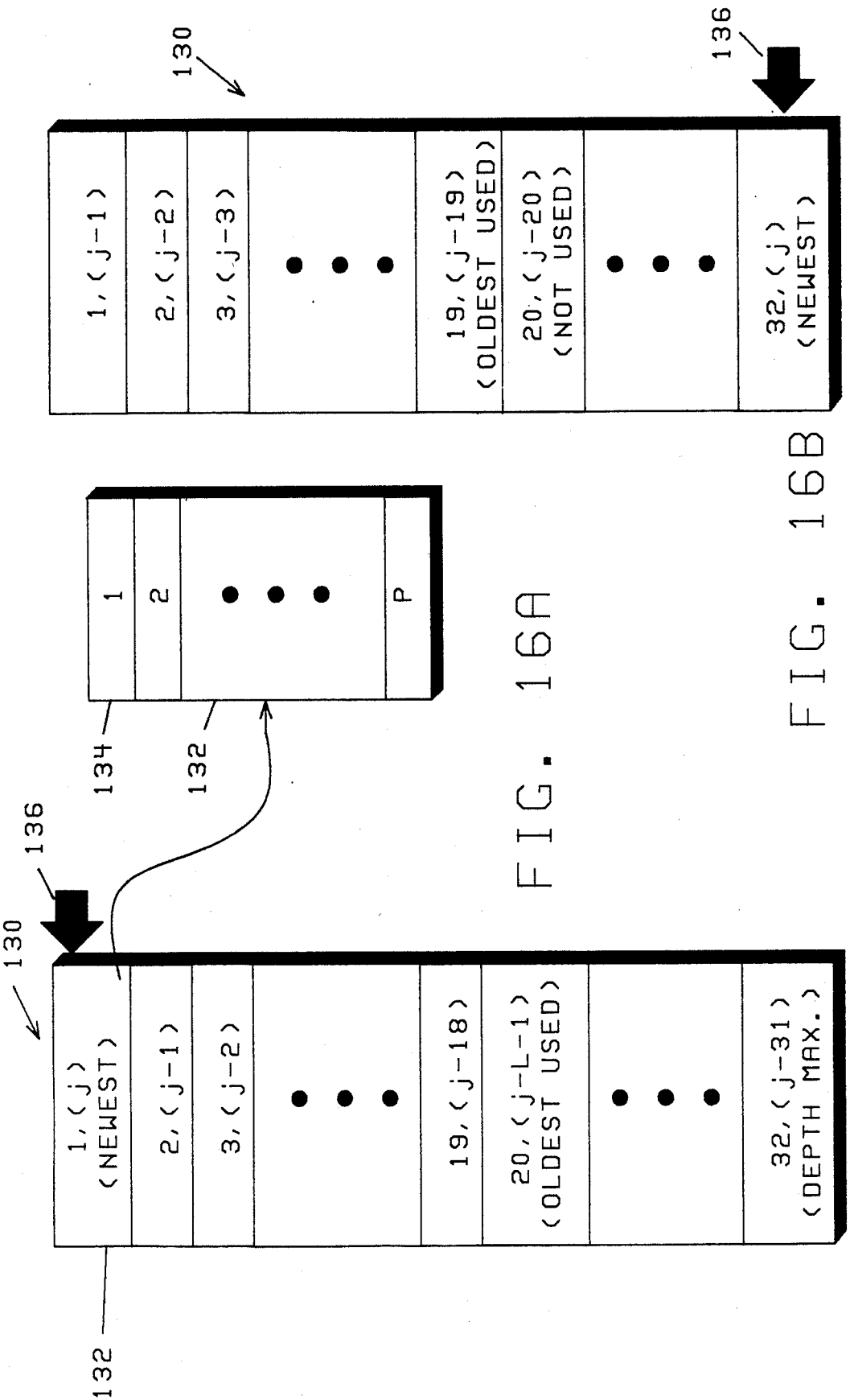
FIG. 16A shows the memory arrangement of a second embodiment of the present invention.
FIG. 16B shows the memory arrangement one group interval after that of FIG. 16A.
FIG. 16C shows the memory arrangement on group interval after that of FIG. 16B.

Referring to FIG. 16A, a memory array 130 is formed in RAM and consists of a plurality of memory blocks 132 (only part shown), with each memory block being composed of a plurality of addressable locations 134 (only part shown). The number of memory blocks 132 is equal to the maximum possible depth (max depth) of the Viterbi algorithm. The truncation length (L) of the Viterbi algorithm, which can be selectively varied by the user, cannot exceed the max depth. In the illustrative embodiment max depth is equal to 32 group intervals, i.e., 128 bauds. Typically, the truncation length would be selected to be 20 or more group intervals, depending upon the condition of the transmission lines. For example, when the truncation length is 20 group intervals, this means the memory blocks 132 numbered 1 through 20 are used. Each block of this sequence of blocks are associated with (indexed to) one of a plurality of time units (group intervals) $j-i$, where $0 \leq i \leq 31$, but only those blocks associated with time units $j-i$, where $0 \leq i \leq L-1$, contain sets of states that are currently used in the path retrieval. As is well-known, the truncation length can be varied as desired. The number of addressable locations in each memory block 132 is equal to the number of states (P) of the trellis, which is 64 in the illustrative embodiment. Consequently, the size of memory array 130 is equal to the max depth times the number of states P and the memory mapping is accomplished by dividing the memory into groups of addressable locations, each of which is associated with (indexed to) a given state, with each of the addressable locations 134 in a given group being associated with a unique time unit and a unique block 132.

The information contained in the memory array 130 can be formatted in a predecessor state, look-up table, such as that shown in FIG. 6. Each memory block 134 correlates with a column and the addressable addresses for the same state of the columns correlates with a row. However, as a practical matter, when the look-up table is implemented in memory, the addressable locations form one long sequence.

Each addressable location 134, which is associated (indexed to) a present state of one of the surviving paths (as described in detail heretofore), contains a previous state of that surviving path. With the passing of each time unit, the states contained within a given block 132 are associated with a progressively older time unit, until the contents of that block is disposed of by using that block for the storage of the most current (newest) states, in a manner to be described hereinafter.

The memory array 130 is updated as follows. Referring to FIG. 16A, when L=20, the illustrative memory block numbers 1 through 20 represent blocks of addressable locations having the states of the surviving paths occurring in time units that initially become progressable older with the block number. For the purposes of explanation, it is initially assumed in FIG. 16A that block 1 is indexed to newest time unit j and that block 20 is indexed to the time unit $j-L-1$. Each group interval, when the states for a new time unit are received for current time unit j, the blocks of states previously indexed to the time units $j-i$, are now indexed to the time units $j-i-1$. Although the contents of each block could be shifted downward to make room for the newest states (each block always indexed to the same time unit), instead, according to the present invention the newest states are put in the block previously associated with the oldest time unit as shown in FIG. 16B. Initially, this is block 32. Each block 132 is identified in the drawings by its block number, followed by the time unit that it is associated with, relative to the current time unit j. Continuing, as shown in FIG. 16C, the position indexed time units rotate on a modulo basis. As shown in FIGS. 16A–16C, to keep track of this rotation, a program stored in ROM uses a data address pointer 136 (labeled offset pointer) to indicate in which memory block 132 the location of the states indexed to the most current (newest) time unit, and, once knowing this, the position of the states for the other time units are known. The pointer 136 jumps from block 1 to block 32, and then each time unit progressively moves to blocks with decreasing block numbers until it again reaches block 1 when it again jumps to block 32.

This offset pointer 136 is updated by modulo arithmetic after each data entry is completed. Also, because of the wrap around nature of modulo arithmetic, no shift-in and shift-out operations are needed. Referring to FIGS. 16A–C, the path update is reduced down to P writes. In the illustrative embodiment, modulo Q arithmetic is used, with the base Q being equal to the number of blocks (and therefore the number of indexed time units), which is 32 in this case (identified as depth max). In the case where L=Q, then the block indexed to j−31, when previously containing the oldest states used during the previous time unit, is used to store the newest states during the subsequent time unit. Where L=20, the newest states replace states that have not been used in path retrieval for several time units.

Figure 17:
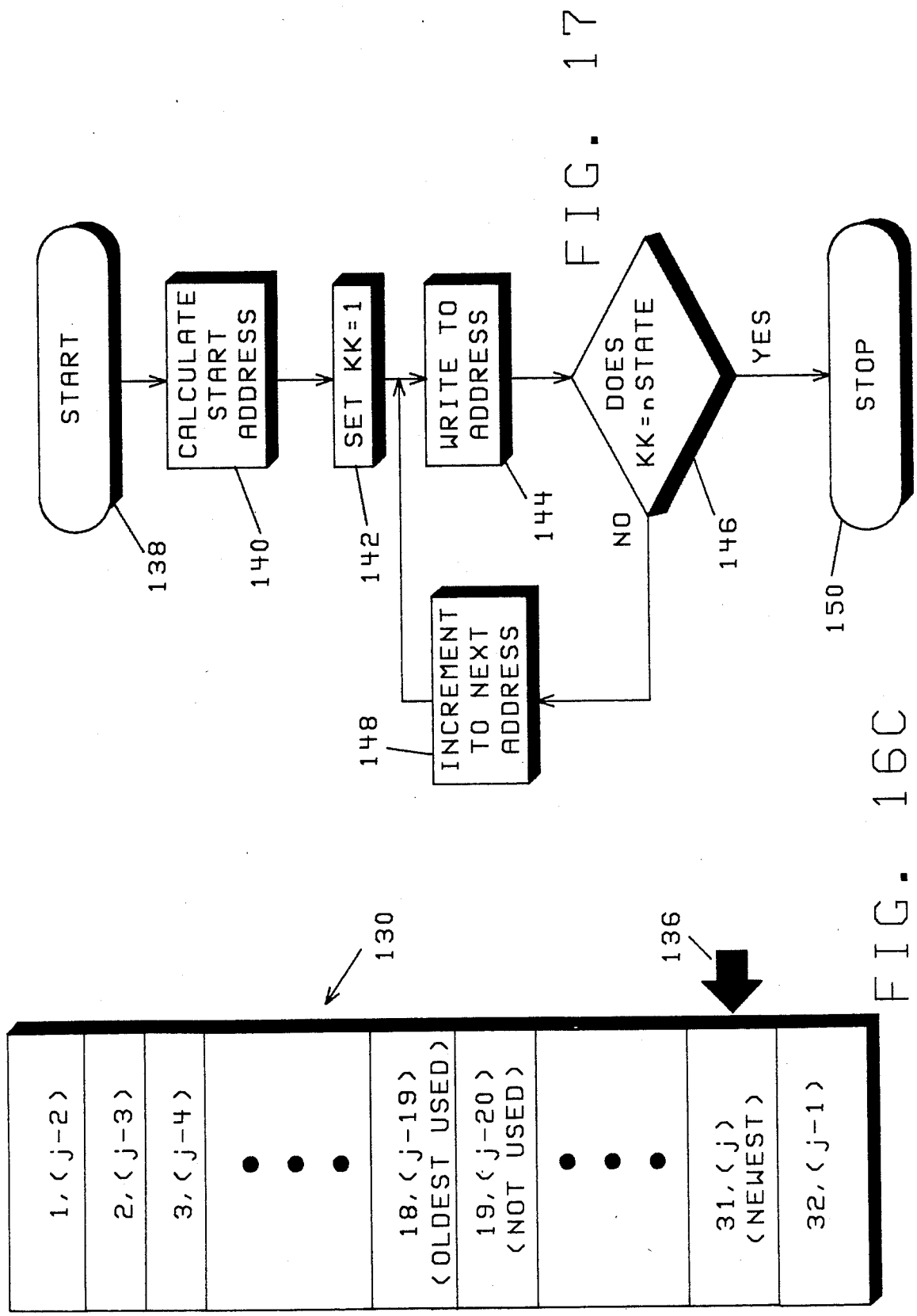
FIG. 17 is a flow chart for the write operation for the memory shown in FIGS. 16A–C.

Referring to FIG. 17, as shown by the flow chart starting at block 138, at block 140 the starting address for the write operation is calculated to be equal to the table origin plus the offset (number of blocks from the table origin to, but not including, the current memory block designated by the offset pointer) times the number of states (P) in the block. The counter at block 142 is set to 1 and at block 144 each of the 64 addressable locations are written to by cycling through the loop of 144, 146 and 148, and the program exits from the loop at block 150 when KK=n state (64 states in the illustrative embodiment) at block 146.

Referring to the flow chart in FIG. 18 and the following discussion of a computer program, the data is retrieved from the memory array in a manner to be described hereinafter. In the program, the following symbols are defined:

| < ... > | Content of the address |
| --- | --- |
| mod (n, m) | Modulo base m of n |
| min node | Minimum node (first and most recent addressable location of maximum likelihood path) |
| table(a, b) | table look-up for the transition bits where a & b are row & column |
| pstate | past (previous) state |
| tptr | table pointer |
| newstat | present (current) state |
| trans bits | transition bits |

First, as previously described, the path with the least cost is selected and the current addressable location (min-node) of that path is therefore known. The program will have the following steps. The blocks of the flow diagram of FIG. 18 are correlated to the program steps by showing the blocks in brackets adjacent to the appropriate steps in the program.

```
tptr = table origin + Q x mod (offset, depth max)
tmin = tptr + min node    ! Table entry [see block 152]
pstate = <tmin>           ! State enters min node
C    loop to retrieve data L frames ago
C    notice that the depth could change accordingly. It is
C    dependent of depth max. Notice that there are L − 1
C    indirect-read
     do for kk = 1, L - 1 [see blocks 154 and 156]
```

```
       newstat = pstate       ! Store pstate
       tptr = table origin + Q x mod (offset + kk, depth max)
             + pstate
       pstate = <tptr>        ! State enters kk frames ago
end do
C    table look-up for transition bits (trans bits) [see block 158]
C    update offset
     trans bits = table (pstate, newstat)
     i.e., trans bits is the recover data
     offset = mod (offset-1, depth max)
C    end of routine, wait for next update
```

Referring to FIG. 19, the arrow on line A—A the points in the direction of rotation of the offset pointer, which wraps around every depth max and the arrow on line B—B shows the direction of the tptr pointer, which wraps around every depth max in the opposite direction from the offset pointer.

Referring back to FIGS. 14 and 15, for each coset, in the branch metric computer 100, one of sixteen parallel branches is selected from each coset based upon a cost. This branch is defined by the subset-defining bits $y_n^0$ to $y_n^7$ of FIG. 13. As previously explained, these selected branches form part of the surviving paths. In its simplest implementation, the subset-defining bits forming a given, selected branch could be stored in the addressable location for the current state for that transition. However, because of practical memory size locations existing in actual implementation of the present invention, it has been found desirable to use a more elaborate arrangement. More specifically, there is stored in the addressable location for a given current state a branch index number from 1 to 16 which identifies the branch (subset-defining bits) within a given coset that was selected based on cost for the transition from a previous state to that particular current state. This requires only 4 bits instead of the 8 bits required to store the branch required to store the subset-defining bits. Additionally, the current state and the previous state are used to access the above-described look-up table discussed with respect to the computer program to obtain the transition bits. In this case, with reference to FIG. 13, the transition bits are a portion of the subset-defining bits, bits $y_n^0$–$y_n^3$, when output bits $y_n^4$ to $y_n^7$ are all zero. In other words, when these latter bits are zero, they do not change the output of the bits $y_n^0$ to $y_n^4$. However, unlike the 2-dimensional modulation embodiment, for the other 15 possibilities in the coset, the transitional bits are not the same as the subset defining bits. However, a portion of the transition bits, which are unique to each coset, are used to identify the coset. With the coset as identified by the transition bits and the branch index number, a second look-up table operation is performed. The contents, which are addressable as a function of the coset number and the index number is shown below in Table 4 and each of the accessed values are the subset-defining bits (as shown by their subset designations) for a given branch within a given subset. It should be noted that the last two subset designations in the first branch of each coset (where $y_n^4$–$y_n^7$ are zero) is the binary equivalent of the decimal coset number, e.g., for coset 7, BIA1 equals 7.

TABLE 4

| Branch Index Number | Coset 7 | Coset 4 | Coset 9 | Coset 10 |
| --- | --- | --- | --- | --- |

TABLE 4-continued

| Branch Index Number | | | | |
|---|---|---|---|---|
| 1 | A0A0B1A1 | A0A0B1A0 | A0A0B0B1 | A0A0B0B0 |
| 2 | A0B1A0A0 | A0B1A0A1 | A0B1A1B0 | A0B1A1B1 |
| 3 | A0B0A1A0 | A0B0A1A1 | A0B0A0B0 | A0B0A0B1 |
| 4 | A0A1B0A1 | A0A1B0A0 | A0A1B1B1 | A0A1B1B0 |
| 5 | B1A0B0B0 | B1A0B0B1 | B1A0B1A0 | B1A0B1A1 |
| 6 | B1B1A1B1 | B1B1A1B0 | B1B1A0A1 | B1B1A0A0 |
| 7 | B1B0A0B1 | B1B0A0B0 | B1B0A1A1 | B1B0A1A0 |
| 8 | B1A1B1B0 | B1A1B1B1 | B1A1B0A0 | B1A1B0A1 |
| 9 | B0A0B0B1 | B0A0B0B0 | B0A0B1A1 | B0A0B1A0 |
| 10 | B0B1A1B0 | B0B1A1B1 | B0B1A0A0 | B0B1A0A1 |
| 11 | B0B0A0B0 | B0B0A0B1 | B0B0A1A0 | B0B0A1A1 |
| 12 | B0A1B1B1 | B0A1B1B0 | B0A1B0A1 | B0A1B0A0 |
| 13 | A1A0B1A0 | A1A0B1A1 | A1A0B0B0 | A1A0B0B1 |
| 14 | A1B1A0A1 | A1B1A0A0 | A1B1A1B1 | A1B1A1B0 |
| 15 | A1B0A1A1 | A1B0A1A0 | A1B0A0B1 | A1B0A0B0 |
| 16 | A1A1B0A0 | A1A1B0A1 | A1A1B1B0 | A1A1B1B1 |
|  | Coset 5 | Coset 6 | Coset 11 | Coset 8 |
| 1 | A0A0B1B1 | A0A0B1B0 | A0A0B0A1 | A0A0B0A0 |
| 2 | A0B1A0B0 | A0B1A0B1 | A0B1A1A0 | A0B1A1A1 |
| 3 | A0B0A1B0 | A0B0A1B1 | A0B0A0A0 | A0B0A0A1 |
| 4 | A0A1B0B1 | A0A1B0B0 | A0A1B1A1 | A0A1B1A0 |
| 5 | B1A0B0A0 | B1A0B0A1 | B1A0B1B0 | B1A0B1B1 |
| 6 | B1B1A1A1 | B1B1A1A0 | B1B1A0B1 | B1B1A0B0 |
| 7 | B1B0A0A1 | B1B0A0A0 | B1B0A1B1 | B1B0A1B0 |
| 8 | B1A1B1A0 | B1A1B1A1 | B1A1B0B0 | B1A1B0B1 |
| 9 | B0A0B0A1 | B0A0B0A0 | B0A0B1B1 | B0A0B1B0 |
| 10 | B0B1A1A0 | B0B1A1A1 | B0B1A0B0 | B0B1A0B1 |
| 11 | B0B0A0A0 | B0B0A0A1 | B0B0A1B0 | B1B0A1B1 |
| 12 | B0A1B1A1 | B0A1B1A0 | B0A1B0B1 | B1A1B0B0 |
| 13 | A1A0B1B0 | A1A0B1B1 | A1A0B0A0 | A1A0B0A1 |
| 14 | A1B1A0B1 | A1B1A0B0 | A1B1A1A1 | A1B1A1A0 |
| 15 | A1B0A1B1 | A1B0A1B0 | A1B0A0A1 | A1B0A0A0 |
| 16 | A1A1B0B0 | A1A1B0B1 | A1A1B1A0 | A1A1B1A1 |
|  | Coset 15 | Coset 12 | Coset 1 | Coset 2 |
| 1 | A0A0A1A1 | A0A0A1A0 | A0A0A0B1 | A0A0A0B0 |
| 2 | A0B1B0A0 | A0B1B0A1 | A0B1B1B0 | A0B1B1B1 |
| 3 | A0B0B1A0 | A0B0B1A1 | A0B0B0B0 | A0B0B0B1 |
| 4 | A0A1A0A1 | A0A1A0A0 | A0A1A1B1 | A0A1A1B0 |
| 5 | B1A0A0B0 | B1A0A0B1 | B1A0A1A0 | B1A0A1A1 |
| 6 | B1B1B1B1 | B1B1B1B0 | B1B1B0A1 | B1B1B0A0 |
| 7 | B1B0B0B1 | B1B0B0B0 | B1B0B1A1 | B1B0B1A0 |
| 8 | B1A1A1B0 | B1A1A1B1 | B1A1A0A0 | B1A1A0A1 |
| 9 | B0A0A0B1 | B0A0A0B0 | B0A0A1A1 | B0A0A1A0 |
| 10 | B0B1B1B0 | B0B1B1B1 | B0B1B0A0 | B0B1B0A1 |
| 11 | B0B0B0B0 | B0B0B0B1 | B0B0B1A0 | B0B0B1A1 |
| 12 | B0A1A1B1 | B0A1A1B0 | B0A1A0A1 | B0A1A0A0 |
| 13 | A1A0A1A0 | A1A0A1A1 | A1A0A0B0 | A1A0A0B1 |
| 14 | A1B1B0A1 | A1B1B0A0 | A1B1B1B1 | A1B1B1B0 |
| 15 | A1B0B1A1 | A1B0B1A0 | A1B0B0B1 | A1B0B0B0 |
| 16 | A1A1A0A0 | A1A1A0A1 | A1A1A1B0 | A1A1A1B1 |
|  | Coset 13 | Coset 14 | Coset 3 | Coset 0 |
| 1 | A0A0A1B1 | A0A0A1B0 | A0A0A0A1 | A0A0A0A0 |
| 2 | A0B1B0B0 | A0B1B0B1 | A0B1B1A0 | A0B1B1A1 |
| 3 | A0B0B1B0 | A0B0B1B1 | A0B0B0A0 | A0B0B0A1 |
| 4 | A0A1A0B1 | A0A1A0B0 | A0A1A1A1 | A0A1A1A0 |
| 5 | B1A0A0A0 | B1A0A0A1 | B1A0A1B0 | B1A0A1B1 |
| 6 | B1B1B1A1 | B1B1B1A0 | B1B1B0B1 | B1B1B0B0 |
| 7 | B1B0B0A1 | B1B0B0A0 | B1B0B1B1 | B1B0B1B0 |
| 8 | B1A1A1A0 | B1A1A1A1 | B1A1A0B0 | B1A1A0B1 |
| 9 | B0A0A0A1 | B0A0A0A0 | B0A0A1B1 | B0A0A1B0 |
| 10 | B0B1B1A0 | B0B1B1A1 | B0B1B0B0 | B0B1B0B1 |
| 11 | B0B0B0A0 | B0B0B0A1 | B0B0B1B0 | B0B0B1B1 |
| 12 | B0A1A1A1 | B0A1A1A0 | B0A1A0B1 | B0A1A0B0 |
| 13 | A1A0A1B0 | A1A0A1B1 | A1A0A0A0 | A1A0A0A1 |
| 14 | A1B1B0B1 | A1B1B0B0 | A1B1B1A1 | A1B1B1A0 |
| 15 | A1B0B1B1 | A1B0B1B0 | A1B0B0A1 | A1B0B0A0 |
| 16 | A1A1A0B0 | A1A1A0B1 | A1A1A1A0 | A1A1A1A1 |

Instead of storing the previous state in the addressable location associated with each current state as in the preferred implementation, an alternative would be to store the subset-defining bit group, (i.e., selected branch, as shown in Table 4) that correlates with the transition from the previous state to the particular current state in the addressable location associated with this current state. In retrieving the path, the current state, along with its associated stored subset-defining bit group can be used to access a look-up table to obtain the previous state, which, as with the preferred embodiment, is used to locate the next addressable location in the previous time unit to be read. Consequently, such an implementation requires an added step for obtaining the previous state. It should be understood that in the claims where it is recited that the addressable location contains the "previous state" of the path, that this term, when used in the claims, not only is intended to cover stored information directly specifying the previous state, but is also intended to cover and read upon the storage of the corresponding subset-defining bit group, which in fact leads to the determination of the previous state. In this latter implementation, after the previous state is looked up, no further look-up operations are required as in the preferred implementation, to obtain the subset-defining bit group, since that information has already been obtained. For convolutional encoders with a large number of states as in this 19.2K modem implementation, this latter technique is not preferred, due to the great size of the look-up table.

Although particular embodiments of the invention have been shown and described here, there is no intention to thereby limit the invention to the details of such embodiments. On the contrary, the intention is to cover all modifications, alternatives, embodiments, usages and equivalents of the subject invention as fall within the spirit and scope of the invention, specification and the appended claims.

What is claimed is:

1. In a Viterbi decoder for determining a maximum likelihood path from a plurality of surviving paths through a trellis, said trellis having a plurality of states repeated for each one of a plurality of time units, with the number of said surviving paths being equal to the number of states in said trellis, said Viterbi decoder having means for storing and retrieving said plurality of surviving paths, the improvement in said means for storing and retrieving said plurality of surviving paths comprising:

memory means having a plurality of groups of addressable locations, the number of said groups being equal to the number of said states in said trellis and each one of said groups being associated with a unique one of said states;

said memory means further having each one of said addressable locations of each said group associated with a unique one of said plurality of time units;

means for storing in each said addressable location, associated with one of said states of one of said surviving paths, the previous state of said one of said surviving paths; and means for retrieval of said maximum likelihood path by repeatedly reading one of said addressable locations associated with said maximum likelihood path to obtain said previous state of said maximum likelihood path and thereby to determine for the previous time unit which of said addressable locations is to be read.

2. In the Viterbi decoder according to claim 1, wherein said means for retrieval of said maximum likelihood path comprises means for using, after a predetermined number of said readings of said addressable locations, a last pair of adjacent, retrieved said states of said maximum likelihood path to determine a best estimated subset-defining bit group.

3. In the Viterbi decoder according to claim 2, wherein in said memory means said addressable locations of each said group are correlated with at least a sequence of L said time units, where L is defined as the truncation length of said Viterbi decoder, whereby each said addressable location is read from said memory means as a function of a given said time unit in conjunction with a given said state to provide said previous state.

4. In the Viterbi decoder according to claim 3, wherein said means for determining said estimated subset-defining bit group uses said states retrieved after L said readings of said addressable locations.

5. In the Viterbi decoder according to claim 4, wherein said time unit comprises a symbol interval.

6. In the Viterbi decoder according to claim 4, wherein said time unit comprises a group interval consisting of a plurality of symbol intervals.

7. In the Viterbi decoder according to claim 2, wherein said memory means includes a wrap around memory, said means for storing in each said addressable location includes a means for storing in said wraparound memory a plurality of newest said states associated with a newest said time unit in said addressable locations associated with an oldest said time unit and offset pointer means for identifying a position in said wraparound memory of said addressable locations associated with said newest time unit.

8. In the Viterbi decoder according to claim 7, wherein in said memory means the number of said addressable locations for each said group is equal to depth max, L is defined as the number of addressable locations of each said group having said states which are retrieved by said means for retrieval, where depth max$\leq$L and wherein said means for retrieval includes means for changing L.

9. In a Viterbi decoder for determining a minimum cost path from a plurality of surviving paths through a trellis which has a plurality of states repeated in each of a plurality of time units, the improvement comprising:
memory means having an addressable location indexed to each combination of one of said time units with one of said states;
means for storing in each said addressable location, indexed to a current said state of one of said surviving paths, a previous said state of said one of said surviving paths; and
means for retrieving said minimum cost path by repeatedly reading one of said addressable locations associated with one of said current states of said minimum cost path to provide said previous state of said minimum cost path which in turn becomes a new said current state of said minimum cost path for a subsequent said reading.

10. In the Viterbi decoder according to claim 9, wherein said means for retrieving further comprises means for using, after a predetermined number of said readings of said addressable locations, a last pair of adjacent, retrieved said states of said minimum cost path to determine a best estimated subset-defining bit group.

11. In the Viterbi decoder according to claim 10, wherein said addressable locations indexed to one said state are indexed to at least a sequence of L said time units, where L is defined as the truncation length of said Viterbi decoder.

12. In the Viterbi decoder according to claim 11, wherein said means for determining said estimated subset-defining bit group uses said states retrieved after L said readings of said addressable locations.

13. In the Viterbi decoder according to claim 11, wherein said time unit comprises symbol interval.

14. In the Viterbi decoder according to claim 13, wherein said time unit comprises a group interval consisting of a plurality of symbol intervals.

15. In the Viterbi decoder according to claim 10, wherein said memory means includes a wraparound memory, said means for storing includes means for storing in said wraparound memory a plurality of newest said states indexed to a newest said time unit in said addressable locations indexed to an oldest said time unit and offset pointer means for identifying a position in said wraparound memory of said group of addressable locations indexed to said newest time unit.

16. In the Viterbi decoder according to claim 15, wherein said memory means the number of said addressable locations for each said group is equal to depth max, L is defined as the number of addressable locations of each said group having said states which are retrieved by said means for retrieval, where depth max$\leq$L and wherein said means for retrieval includes means for changing L.

17. In a method for determining a minimum cost path from a plurality of surviving paths through a trellis which has a plurality of states repeated in each of a plurality of time units, the improvement comprising the steps of:
indexing an addressable location in a memory to each unique combination of one of said time units with one of said states;
storing in each said addressable location, indexed to one of said states of one of said surviving paths, a previous said state of said one of said surviving paths; and
starting with said addressable locations indexed to the newest said time unit, retrieving said minimum cost path by repeatedly reading one of said addressable locations associated with one of said states of said minimum cost path to provide said previous state of said minimum cost path which in turn defines which one of said addressable locations indexed to the next prior time unit is to be read next.

18. In the method according to claim 17, wherein said step of retrieving further comprises using, after a predetermined number of said readings of said addressable locations, a last pair of adjacent, retrieved said states of said minimum cost path to determine a best estimated subset-defining bit group.

19. In the method according to claim 18, wherein said step of indexing includes correlating said addressable locations of each said group with at least a sequence of L said time units, where L is defined as the truncation length of said Viterbi decoder.

20. In the method according to claim 19, wherein said step of determining said estimated subset-defining bit group includes using said states retrieved after L said readings of said addressable locations.

21. In the method according to claim 18, wherein said step of storing includes storing in a wraparound memory a plurality of newest said states associated with a newest said time unit in said addressable locations associated with an oldest said time unit and identifying a position in said wraparound memory of said group of addressable locations associated with said newest time unit by use of an offset pointer.

22. In the method according to claim 21, wherein said addressable locations indexed to a given said state is equal to depth max, L is defined as the number of addressable locations of indexed to said given state which are retrieved, where the depth max$\leq$L and further including the step of changing L.

* * * * *